(12) United States Patent
Morrow et al.

(10) Patent No.: US 11,942,526 B2
(45) Date of Patent: Mar. 26, 2024

(54) INTEGRATED CIRCUIT CONTACT STRUCTURES

(71) Applicant: Intel Corporation, Santa Clara, CA (US)

(72) Inventors: Patrick Morrow, Portland, OR (US);
Glenn A. Glass, Portland, OR (US);
Anand S. Murthy, Portland, OR (US);
Rishabh Mehandru, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 629 days.

(21) Appl. No.: 16/487,077

(22) PCT Filed: Mar. 28, 2017

(86) PCT No.: PCT/US2017/024413
§ 371 (c)(1),
(2) Date: Aug. 19, 2019

(87) PCT Pub. No.: WO2018/182572
PCT Pub. Date: Oct. 4, 2018

(65) Prior Publication Data
US 2020/0152750 A1    May 14, 2020

(51) Int. Cl.
*H01L 29/417* (2006.01)
*H01L 21/285* (2006.01)
(Continued)

(52) U.S. Cl.
CPC .. *H01L 29/41791* (2013.01); *H01L 21/28568* (2013.01); *H01L 29/66795* (2013.01); *H01L 29/7851* (2013.01)

(58) Field of Classification Search
CPC ......... H01L 29/41791; H01L 21/28568; H01L 29/66795; H01L 29/7851; H01L 21/743;
(Continued)

(56) References Cited

U.S. PATENT DOCUMENTS 5,731,217 A    3/1998  Kadosh et al.
7,719,033 B2 *  5/2010  Jeong .................. H01L 27/0688
                                                257/70
(Continued)

FOREIGN PATENT DOCUMENTS

WO         2014209278 A1    12/2014
WO    WO-2014209278 A1 *   12/2014  ........... H01L 29/785
(Continued)

OTHER PUBLICATIONS

International Search Report and Written Opinion in International Patent Application No. PCT/US2017/024413 dated Dec. 27, 2017, 11 pages.
(Continued)

*Primary Examiner* — Shahed Ahmed
*Assistant Examiner* — Sun Mi Kim King
(74) *Attorney, Agent, or Firm* — Akona IP PC

(57) ABSTRACT

Disclosed herein are integrated circuit (IC) contact structures, and related devices and methods. For example, in some embodiments, an IC contact structure may include an electrical element, a metal on the electrical element, and a semiconductor material on the metal. The metal may conductively couple the semiconductor material and the electrical element.

20 Claims, 19 Drawing Sheets

(51) Int. Cl.
*H01L 29/66* (2006.01)
*H01L 29/78* (2006.01)

(58) Field of Classification Search
CPC ............ H01L 21/76897; H01L 29/165; H01L 29/7848; H01L 29/66545; H01L 27/0922; H01L 21/8221; H01L 27/0688
See application file for complete search history.

(56) References Cited

U.S. PATENT DOCUMENTS

| | | | |
|---|---|---|---|
| 2005/0151276 A1* | 7/2005 | Jang | H01L 27/11 257/427 |
| 2010/0155932 A1* | 6/2010 | Gambino | G06F 30/39 257/698 |
| 2010/0195375 A1 | 8/2010 | Park et al. | |
| 2012/0068179 A1* | 3/2012 | Ishida | H01L 29/458 257/E21.585 |
| 2013/0126881 A1 | 5/2013 | Erickson et al. | |
| 2016/0064545 A1 | 3/2016 | Pillarisetty et al. | |

FOREIGN PATENT DOCUMENTS

| | | | | |
|---|---|---|---|---|
| WO | WO-2017171842 A1 * | 10/2017 | ......... | H01L 27/0886 |
| WO | 2018182572 A1 | 10/2018 | | |

OTHER PUBLICATIONS

International Preliminary Search Report on Patentability in International Patent Application No. PCT/US2017/024413 dated Oct. 10, 2019, 10 pages.

\* cited by examiner

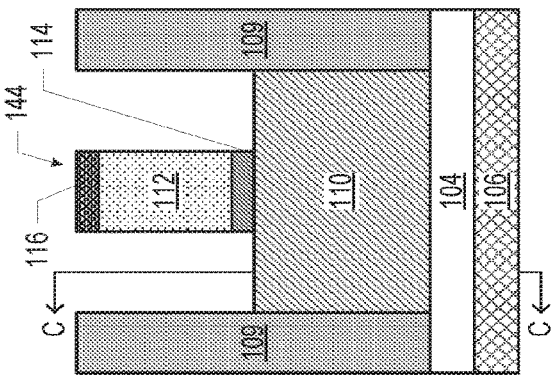
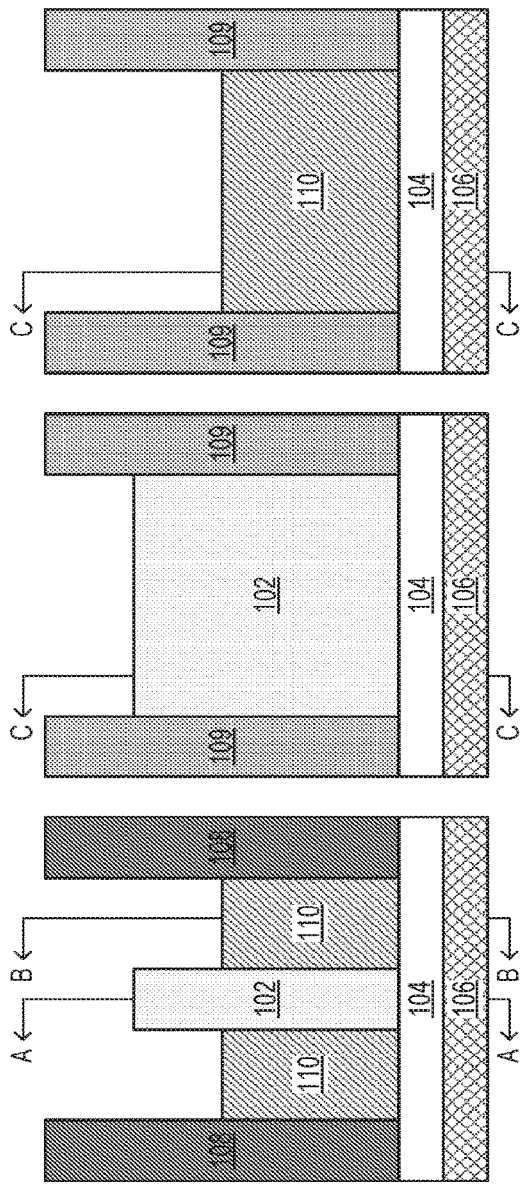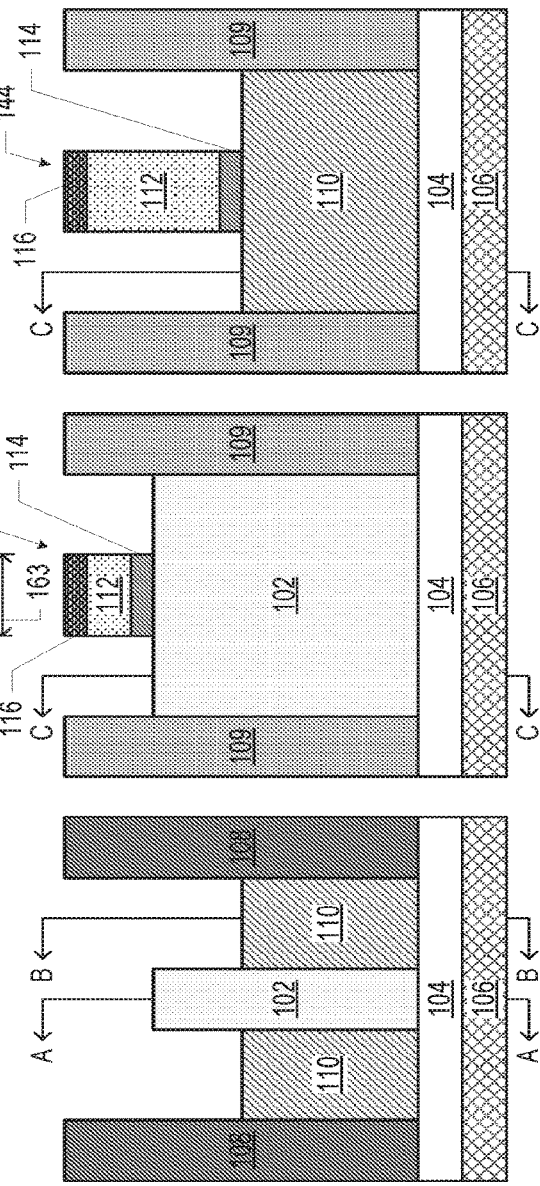

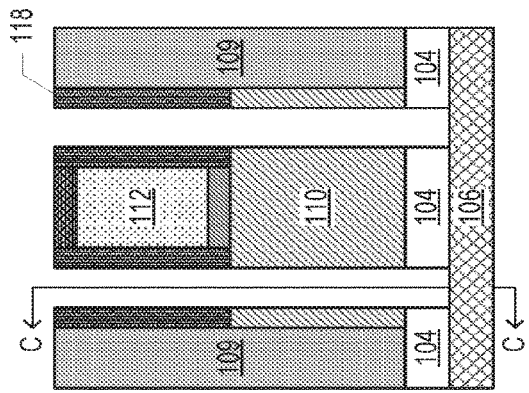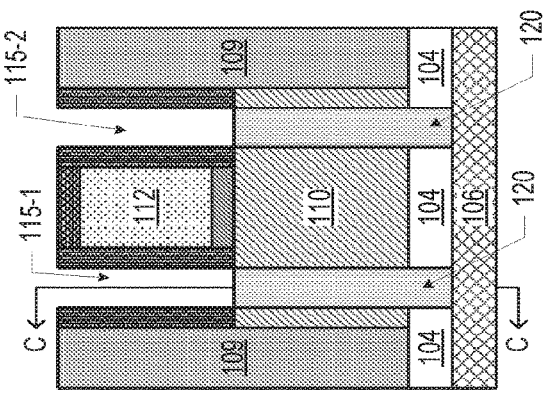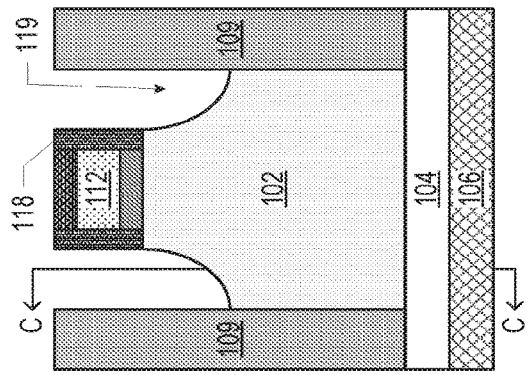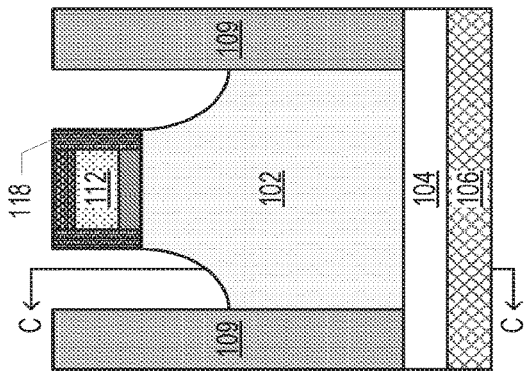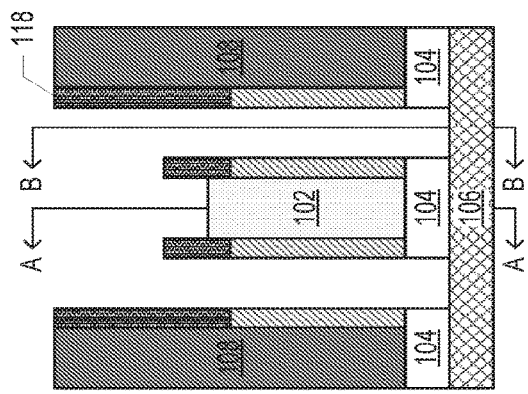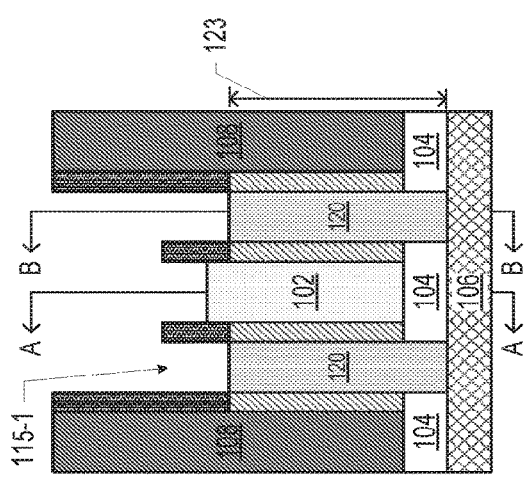

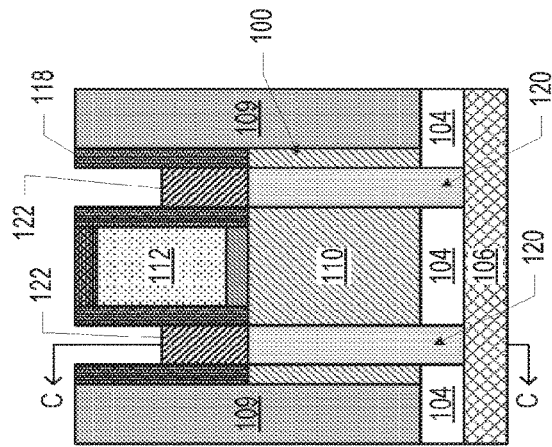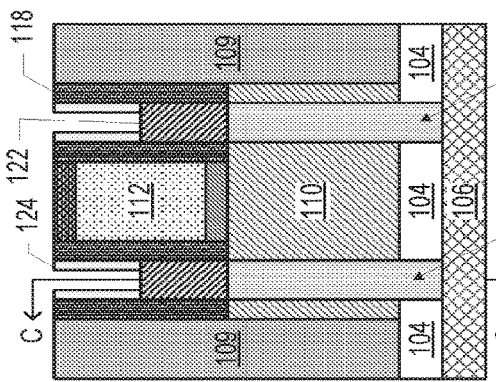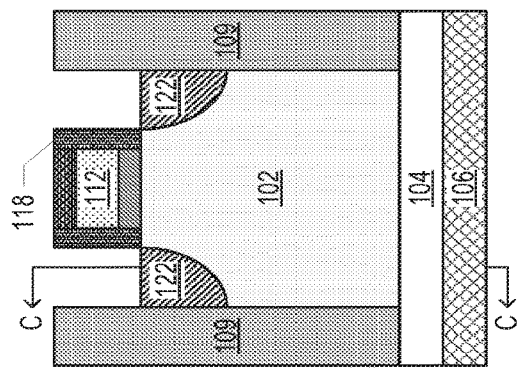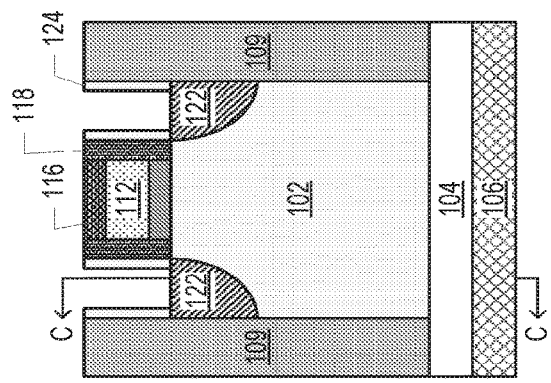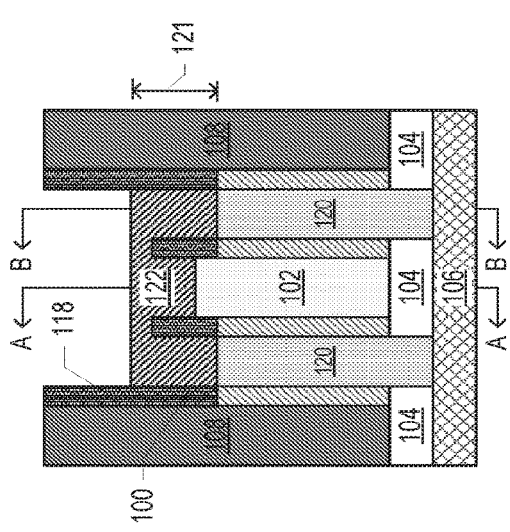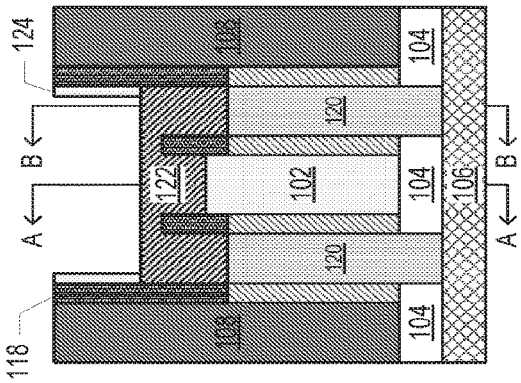

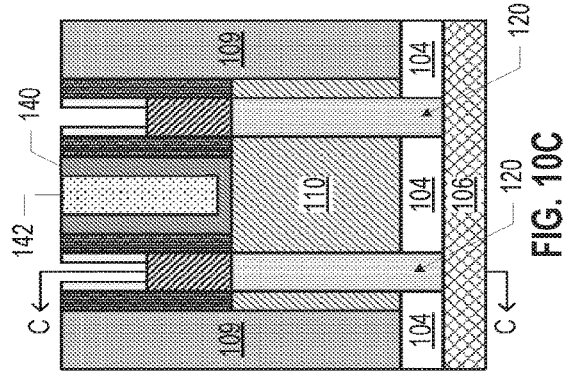
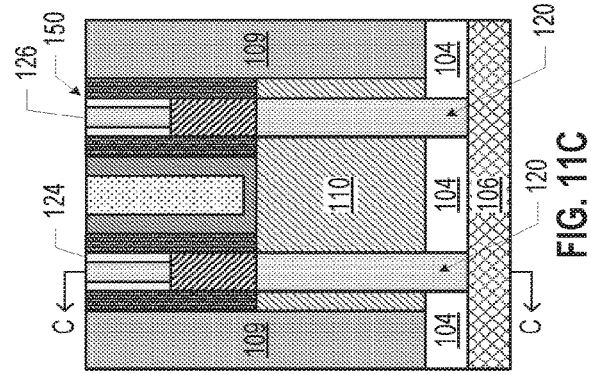
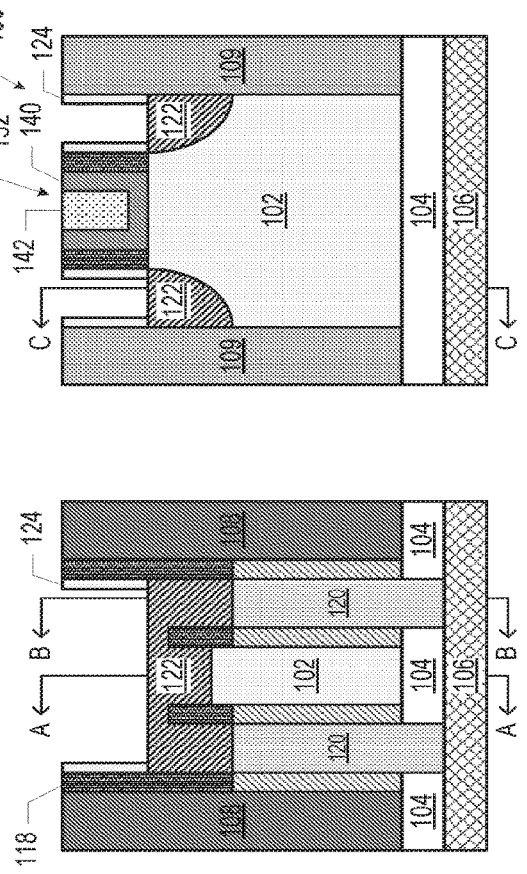
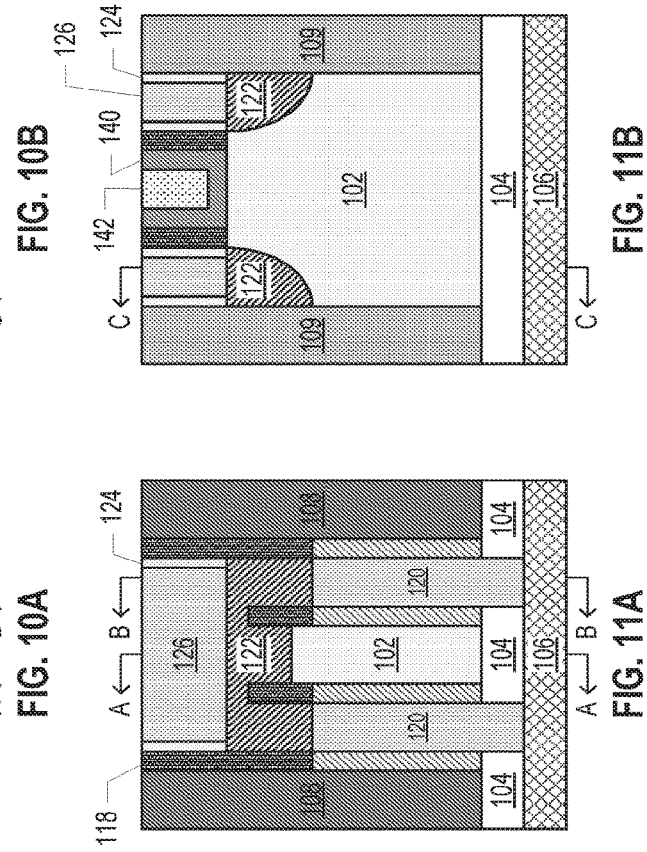

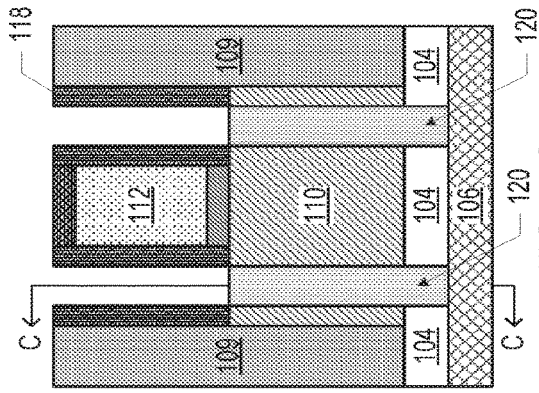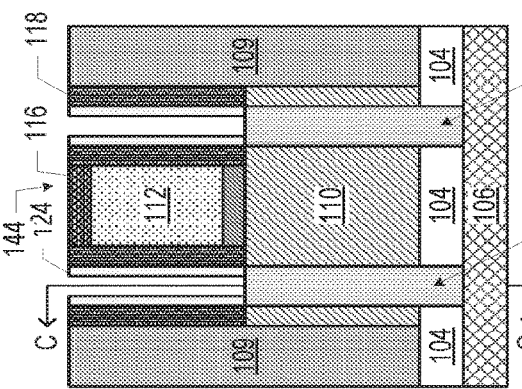
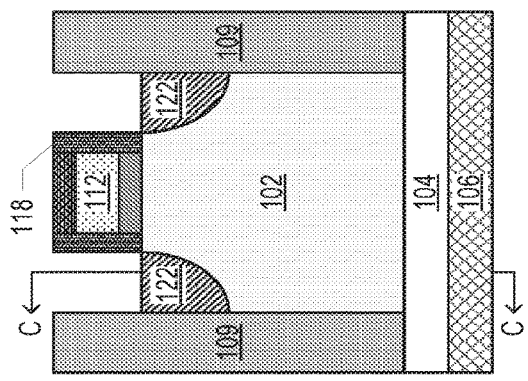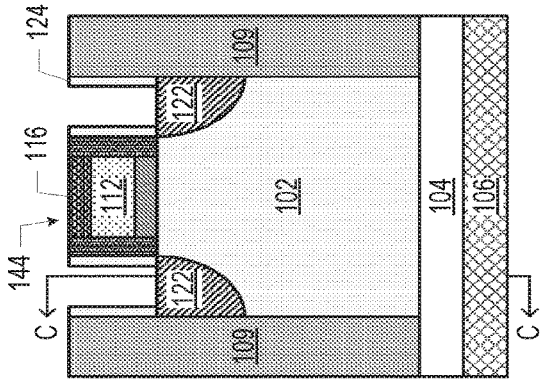
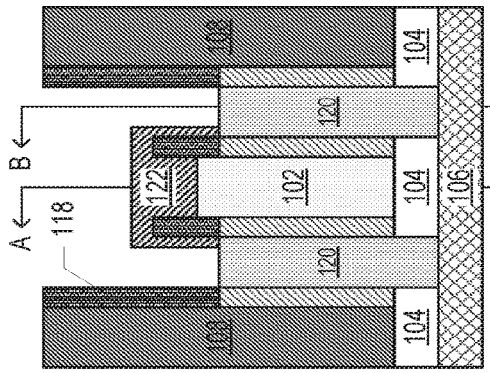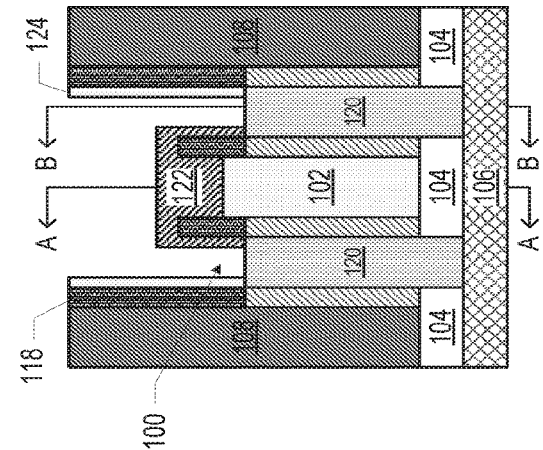

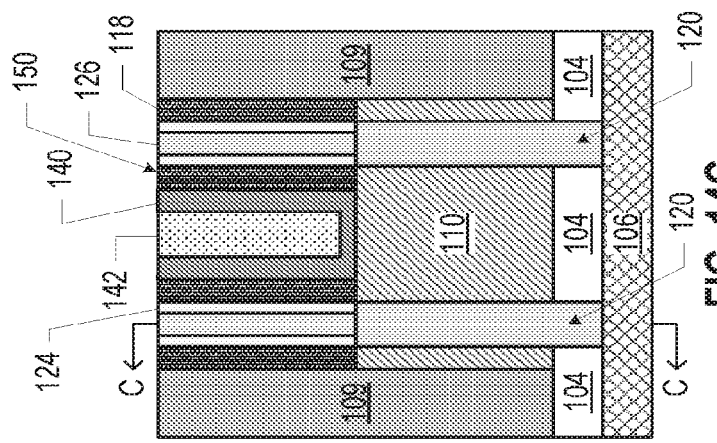
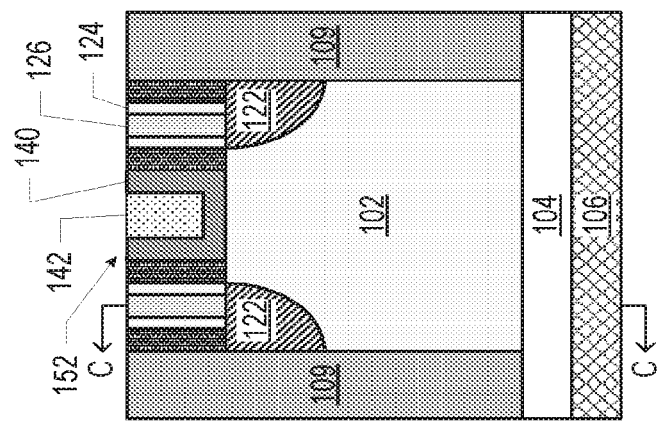
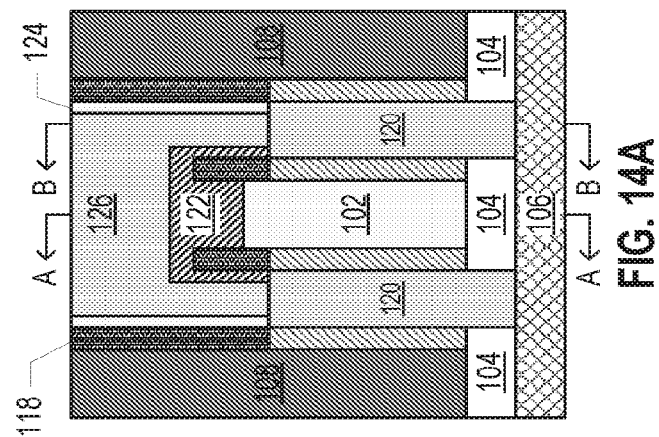

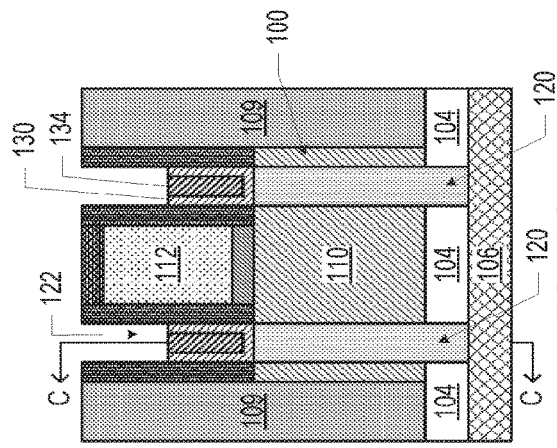
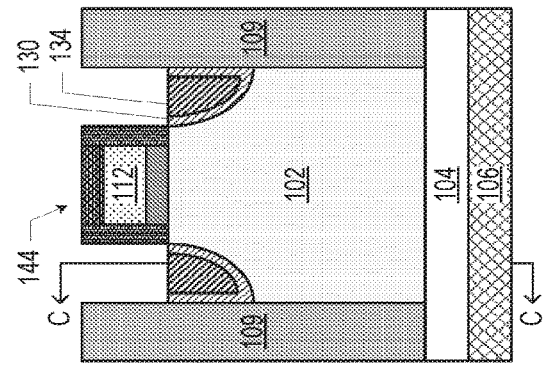
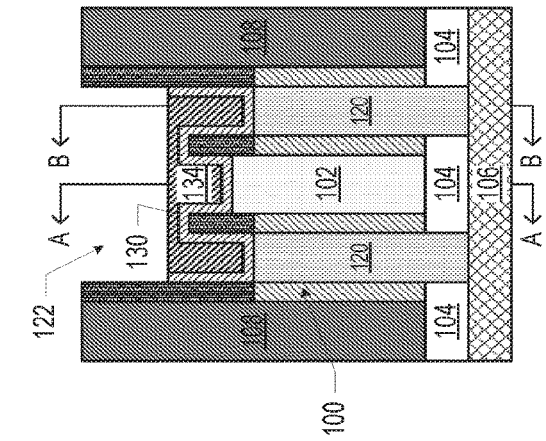
FIG. 19A  FIG. 19B  FIG. 19C
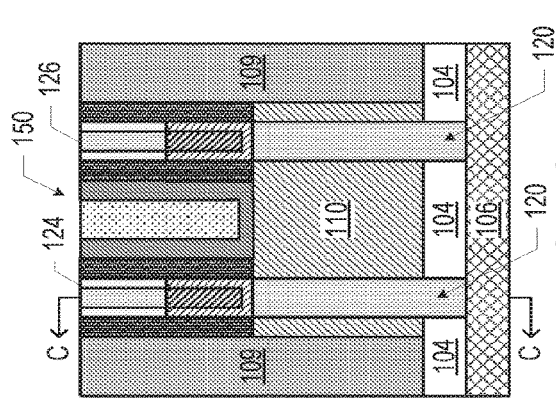
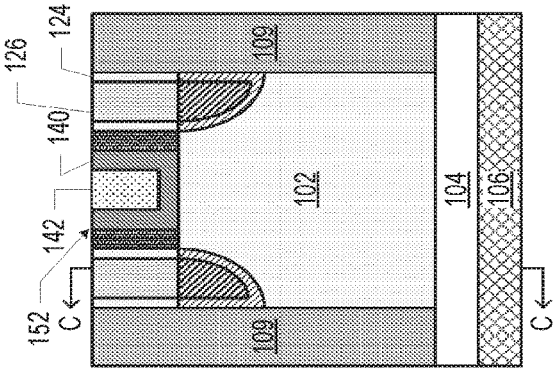
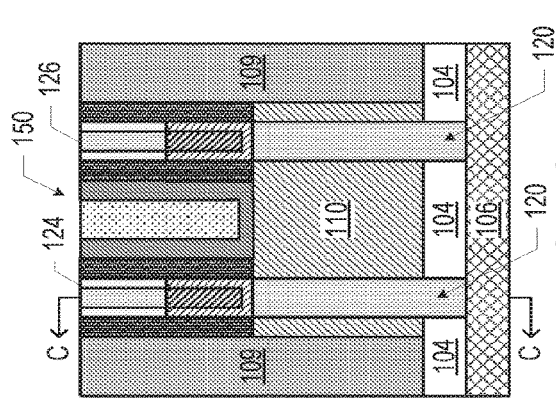
FIG. 20A  FIG. 20B  FIG. 20C

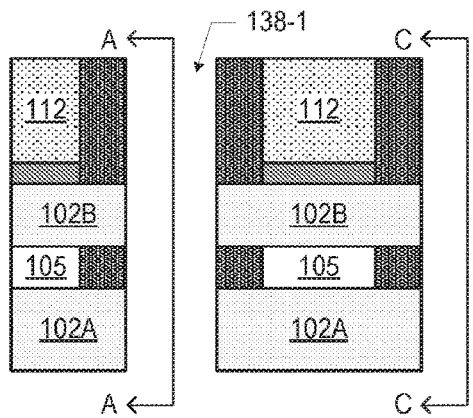 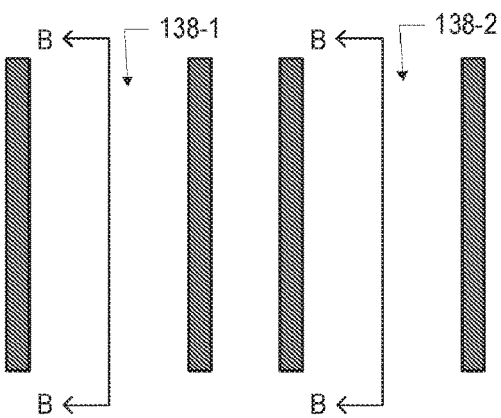
FIG. 28A    FIG. 28B    FIG. 28C
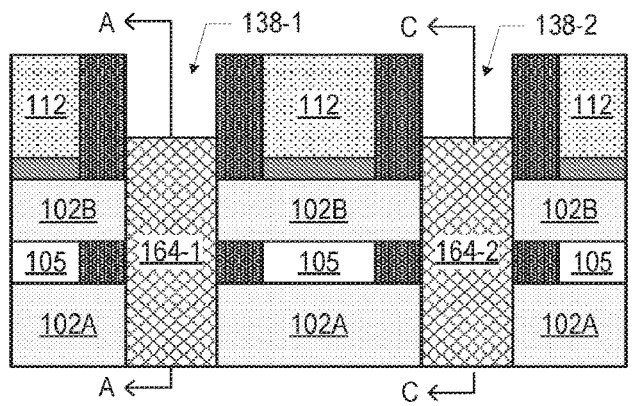 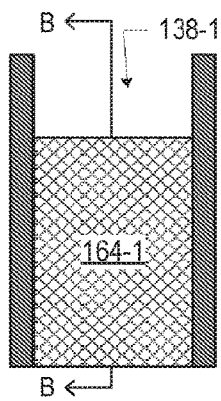 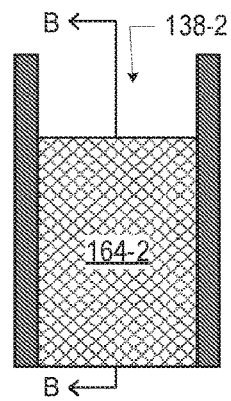
FIG. 29A    FIG. 29B    FIG. 29C
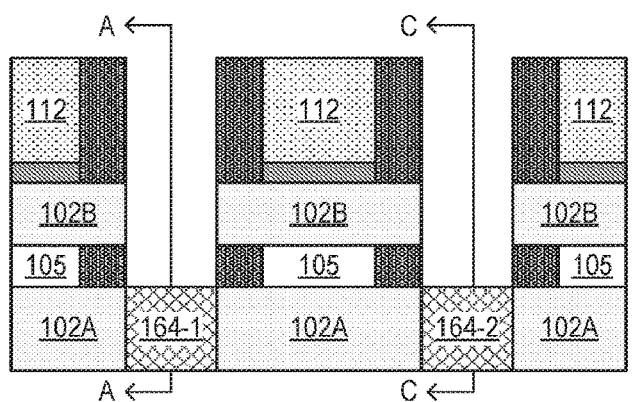 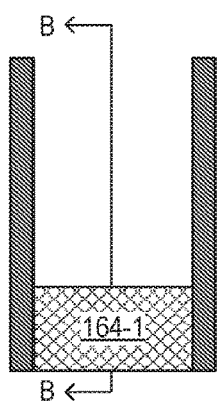 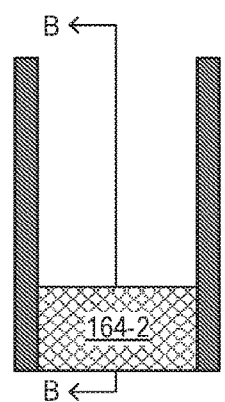
FIG. 30A    FIG. 30B    FIG. 30C

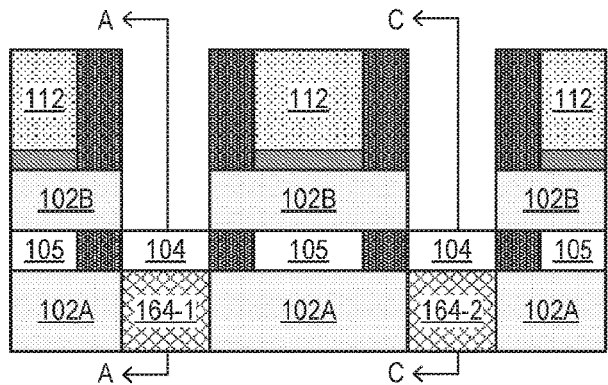 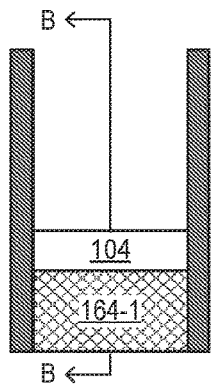 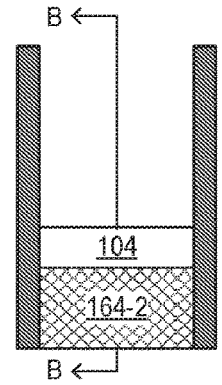
FIG. 31A  FIG. 31B  FIG. 31C
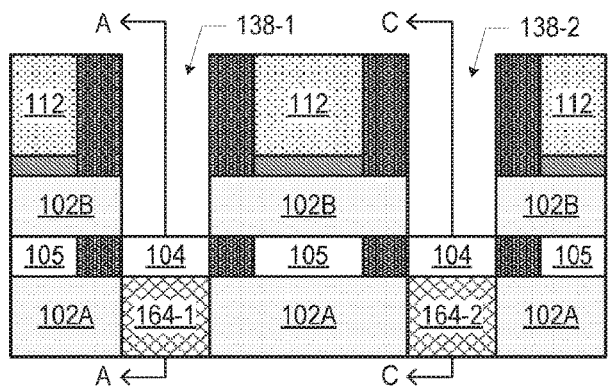 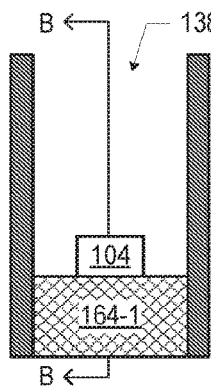 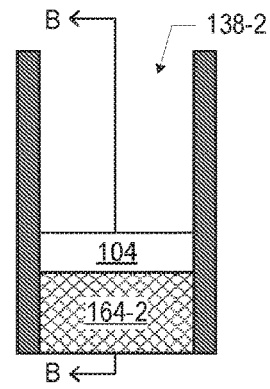
FIG. 32A  FIG. 32B  FIG. 32C
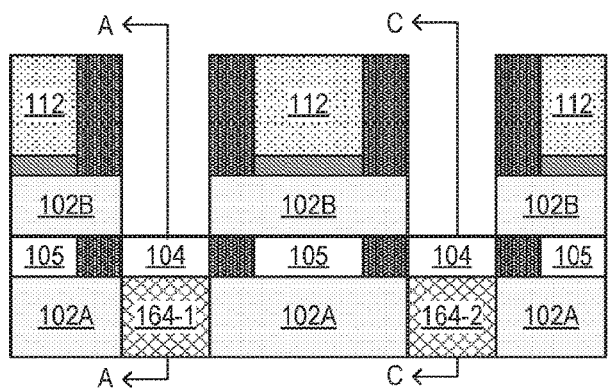 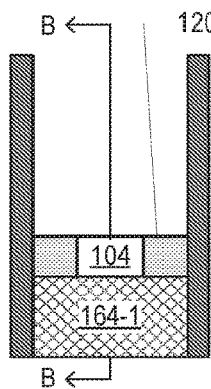 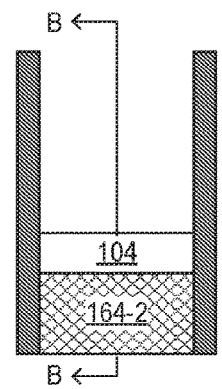
FIG. 33A  FIG. 33B  FIG. 33C

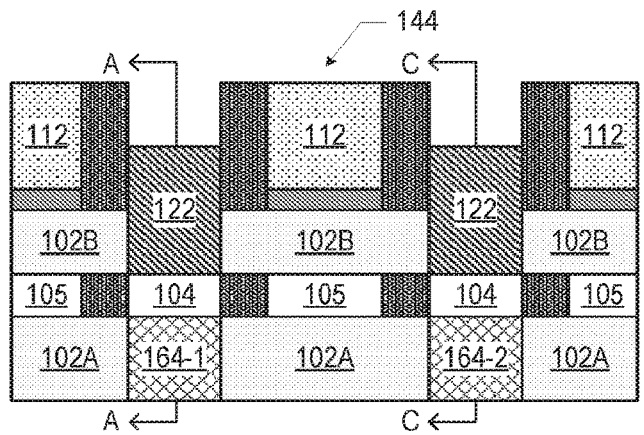 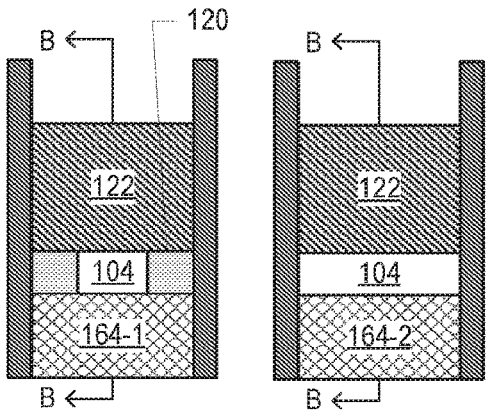 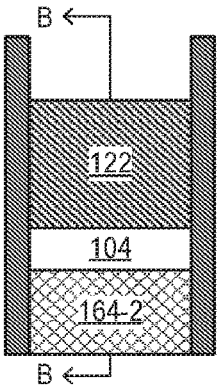
FIG. 34A    FIG. 34B    FIG. 34C
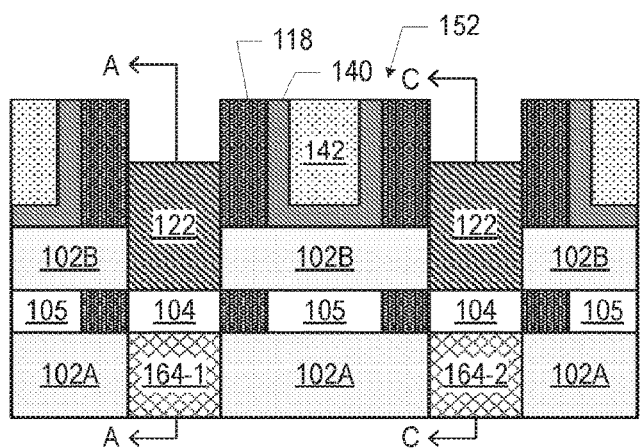 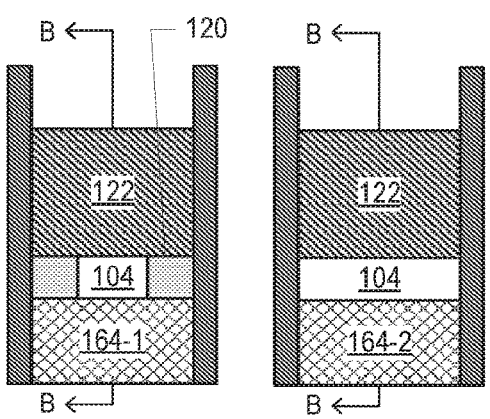 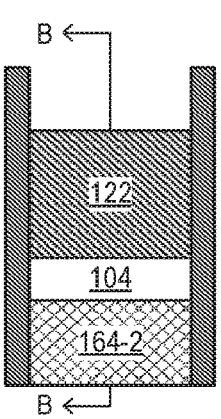
FIG. 35A    FIG. 35B    FIG. 35C
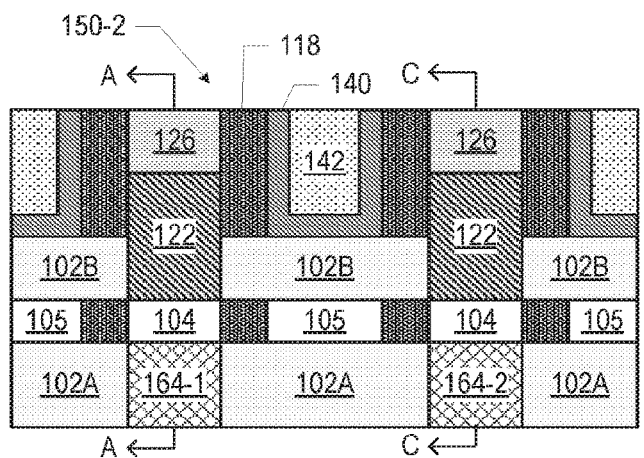 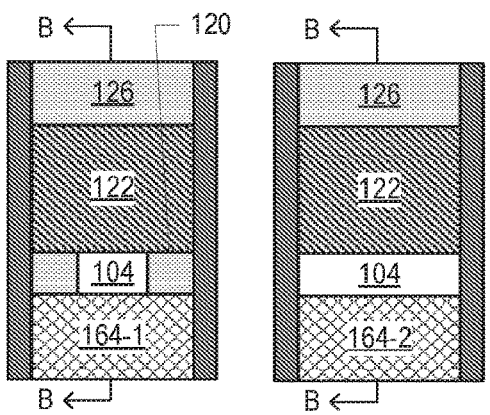 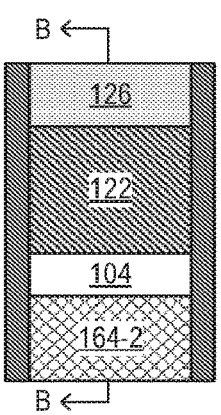
FIG. 36A    FIG. 36B    FIG. 36C

INTEGRATED CIRCUIT CONTACT STRUCTURES

CROSS-REFERENCE TO RELATED APPLICATION

This application is a national stage application under 35 U.S.C. § 371 of PCT International Application Serial No. PCT/US2017/024413, filed on Mar. 28, 2017 and entitled "INTEGRATED CIRCUIT CONTACT STRUCTURES," which is hereby incorporated by reference herein in its entirety.

BACKGROUND

Integrated circuit (IC) devices typically include electrical pathways between electrical components in different layers of the device; such pathways may include horizontal portions (e.g., conductive lines) and/or vertical portions (e.g., conductive vias).

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example, and not by way of limitation, in the figures of the accompanying drawings.

FIG. 1 is a cross-sectional view of an integrated circuit (IC) contact structure, in accordance with various embodiments.

FIGS. 2A-2C, 3A-3C, 4A-4C, 5A-5C, 6A-6C, 7A-7C, 8A-8C, 9A-9C, 10A-10C, and 11A-11C are cross-sectional views of various stages in the manufacture of an assembly including a transistor and an IC contact structure in accordance with FIG. 1.

FIGS. 12A-12C, 13A-13C, and 14A-14C are various views of stages in the manufacture of an assembly including a transistor and another IC contact structure in accordance with FIG. 1.

FIGS. 15A-15C, 16A-16C, 17A-17C, 18A-18C, 19A-19C, and 20A-20C are cross-sectional views of various stages in the manufacture of an assembly including a transistor and another IC contact structure in accordance with FIG. 1.

FIGS. 25A-25C, 26A-26C, 27A-27C, 28A-28C, 29A-29C, 30A-30C, 31A-31C, 32A-32C, 33A-33C, 34A-34C, 35A-35C, and 36A-36C are cross-sectional views of various stages in the manufacture of an inverter circuit element including IC contact structures in accordance with FIG. 1.

DETAILED DESCRIPTION

Figure 4B:
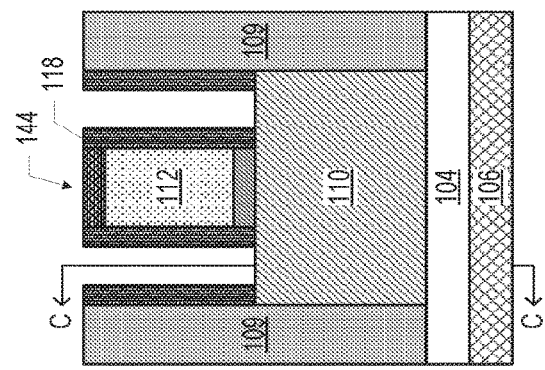

Disclosed herein are integrated circuit (IC) contact structures, and related devices and methods. For example, in some embodiments, an IC contact structure may include an electrical element, a metal on the electrical element, and a semiconductor material on the metal. The metal may conductively couple the semiconductor material and the electrical element. In another example, an IC contact structure may include an electrical element, a metal on the electrical element, and a semiconductor material having a doped portion that is adjacent to the metal. The metal may conductively couple the doped portion and the electrical element.

The IC contact structures disclosed herein may be used advantageously in a number of different device settings. For example, some IC devices may include transistors located above the conventional device layer on the substrate; these transistors may be positioned in an additional device layer higher up in an interlayer dielectric stack, above transistors in the lowest device layer. Because these IC devices include transistors arrayed in the z-direction (as well as the x- and y-directions), these IC devices may be referred to as "three-dimensional" devices. It may be desirable to make connections from the source/drain (S/D) of these "upper" transistors in a monolithic device down to transistors or other electrical elements "lower" in the interlayer dielectric stack. Such connections may be made by routing a metal laterally out from the S/D of an upper transistor and then vertically downward, but this approach may consume valuable x-y area.

The IC contact structures disclosed herein may be used in the three-dimensional device setting (as well as in other settings) to reduce the x-y footprint of connections between an upper transistor and a lower electrical element, thereby increasing transistor density and improving device performance. Some of the embodiments disclosed herein may include epitaxial growth of a semiconductor material for an S/D region (e.g., silicon or germanium) at least partially on a previously formed metal contact. Other embodiments disclosed herein may create S/D regions in a transistor by doping (e.g., ion implantation) rather than epitaxial growth, and a metal contact adjacent to the S/D regions may extend vertically down to an electrical element. A number of these, and other, embodiments are discussed in detail herein.

In the following detailed description, reference is made to the accompanying drawings that form a part hereof, wherein like numerals designate like parts throughout, and in which is shown, by way of illustration, embodiments that may be practiced. It is to be understood that other embodiments may be utilized and structural or logical changes may be made without departing from the scope of the present disclosure. Therefore, the following detailed description is not to be taken in a limiting sense.

Various operations may be described as multiple discrete actions or operations in turn, in a manner that is most helpful in understanding the claimed subject matter. However, the order of description should not be construed as to imply that these operations are necessarily order dependent. In particular, these operations may not be performed in the order of presentation. Operations described may be performed in a different order from the described embodiment. Various additional operations may be performed, and/or described operations may be omitted in additional embodiments.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B, and C). For ease of discussion, the term "FIG. 2" may be used to refer to the collection of drawings of FIGS. 2A-2C, the term "FIG. 3" may be used to refer to the collection of drawings of FIGS. 3A-3C, etc. As used herein, the term "electrical element" may include elements that are semiconductive (e.g., doped or epitaxial regions of a transistor). As used herein, the term "between" when used to describe a range includes the ends of the range.

The description uses the phrases "in an embodiment" or "in embodiments," which may each refer to one or more of the same or different embodiments. Furthermore, the terms "comprising," "including," "having," and the like, as used with respect to embodiments of the present disclosure, are synonymous. The disclosure may use perspective-based descriptions such as "above," "below," "top," "bottom," and "side"; such descriptions are used to facilitate the discussion and are not intended to restrict the application of disclosed embodiments. The accompanying drawings are not necessarily drawn to scale. Although various elements in the accompanying drawings are illustrated as being substantially rectangular or otherwise having flat faces, it will be understood that these elements, when manufactured in accordance with practical techniques, may be rounded or otherwise shaped differently from their representation of the accompanying drawings. For example, the semiconductor body 102 illustrated in a number of the drawings as a substantially rectangular "fin" may, in practice, be shaped as a rounded ridge. In another example, the interface between different materials may have significant roughness.

FIG. 1 is a cross-sectional view of an IC contact structure 100, in accordance with various embodiments. The IC contact structure 100 may include an electrical element 106, a semiconductor material 122, and a metal 120 that conductively couples the electrical element 106 and the semiconductor material 122. Although the electrical element 106, the metal 120, and the semiconductor material 122 of FIG. 1 are drawn as laterally coextensive, this is simply for ease of illustration, and the metal 120 may provide a conductive pathway between the electrical element 106 and the semiconductor material 122 using any particular geometry of the IC contact structure 100. The interface between the metal 120 and the semiconductor material 122 may provide a Schottky junction.

The electrical element 106 may include any suitable electrical element or portion of an electrical element. In some embodiments, the electrical element 106 may be a conductive line (e.g., in accordance with any of the embodiments of the trench structures 2428a discussed below with reference to FIG. 40) or a conductive via (e.g., in accordance with any of the embodiments of the via structures 2428b discussed below with reference to FIG. 40). In some embodiments, the electrical element 106 may be a portion of an electrical device, such as a diode, varactor, capacitor, resistor (e.g., variable resistor), or a memory cell (e.g., a magnetic random-access memory (MRAM) cell).

In some embodiments, the electrical element 106 may be a portion of a transistor, such as a gate or a source/drain (S/D) region. For example, the electrical element 106 may be a portion of a transistor 2440 in accordance with any of the embodiments discussed below with reference to FIG. 40 (e.g., the electrical element 106 may be a portion of a gate 2422 or an S/D region 2420 of a planar or non-planar transistor 2440). In some particular embodiments, the electrical element 106 may be an "embedded epi" S/D region of a transistor or a doped S/D region of a transistor; various examples of S/D configurations are discussed in further detail below. In some embodiments, the electrical element 106 may be a front-end transistor (e.g., a transistor formed in a device layer on or closest to a substrate of the IC device, as discussed below with reference to FIG. 40). In other embodiments, the electrical element 106 may be a non-front-end transistor (e.g., a transistor formed in an interconnect layer that is spaced apart from a device layer on or closest to a substrate of the IC device, as discussed below with reference to FIG. 40).

The metal 120 may include any suitable metal. In some embodiments, the metal 120 may include tungsten, titanium (e.g., titanium nitride), nickel, platinum, gold, tantalum, molybdenum, erbium, strontium, magnesium, scandium, niobium, vanadium, cesium, calcium, zinc, copper, cobalt, nickel zirconium, yttrium, sulfur, manganese, iron, indium, tin, antimony, bismuth, cadmium, silver, palladium, rhodium, ruthenium, rubidium, selenium, gallium, osmium, rhenium, hafnium, lanthanides, and/or any combination thereof. The material composition of the metal 120 may depend upon the setting of the IC contact structure 100. For example, the material composition of the metal 120 may be selected to provide a low Schottky barrier height between the metal 120 and the semiconductor material 122.

The semiconductor material 122 may include any semiconductor, such as silicon or germanium. In some embodiments, the semiconductor material 122 may be grown on the metal 120. For example, the semiconductor material 122 may be grown by epitaxial processes on the metal 120. As discussed below, the semiconductor material 122 may be substantially homogeneous, or may not be substantially homogeneous. For example, in some embodiments in which the semiconductor material 122 includes portions grown on a metal 120 and portions grown on a crystalline material (e.g., such as the semiconductor body 102, discussed below), the portions of the semiconductor material 122 grown on the metal 120 may be polycrystalline, while the portions grown on the crystalline material may be crystalline. In some embodiments, the semiconductor material 122 may include different portions associated with different deposition techniques. For example, the semiconductor material 122 may include a conformal layer of semiconductor material 130 and a semiconductor material fill portion 134, as discussed below with reference to FIGS. 13-20.

The semiconductor material 122 may have an n-type conductivity or a p-type conductivity. In some embodiments, the semiconductor material 122 may have a doping concentration between $1\times10^{18}$ atoms/cm$^3$ to $1\times10^{21}$ atoms/cm$^3$. The semiconductor material 122 may have a uniform doping concentration or may include sub-regions of different concentrations or dopant profiles.

The semiconductor material 122 may include any suitable semiconductor material or combination of materials. For example, in some embodiments, the semiconductor material 122 may include an epitaxially grown single crystalline semiconductor such as, but not limited to, silicon, germanium, germanium tin, silicon germanium, gallium arsenide, indium antimonide, gallium phosphide, gallium antimonide, indium aluminum arsenide, indium gallium arsenide, gallium antimony phosphide, gallium arsenic antimonide, gallium nitride, gallium phosphide, and/or indium phosphide. In some embodiments, the semiconductor material 122 may include a III-V material.

The IC contact structure 100 of FIG. 1 may be implemented in any suitable manner, and a number of examples are discussed below with reference to FIGS. 2-11, FIGS. 12-14, and FIGS. 15-20. For example, FIGS. 2-11 are cross-sectional views of various stages in the manufacture of an assembly including a transistor 150 having an IC contact structure 100 in accordance with FIG. 1. In particular, the "A" sub-figures of FIGS. 2-11 are cross-sectional views across a semiconductor body 102 (taken along the section C-C of the "B" and "C" sub-figures), the "B" sub-figures of FIGS. 2-11 are cross-sectional views along the semiconductor body 102 (taken along the section A-A of the "A" sub-figures), and the "C" sub-figures of FIGS. 2-11 are cross-sectional views offset from the semiconductor body 102 (taken along the section B-B of the "A" sub-figures).

FIG. 2 depicts an assembly including an electrical element 106 and an insulating material 104 disposed thereon. The electrical element 106 may take the form of any of the embodiments disclosed herein. The insulating material 104 may include any suitable insulating material, such as an oxide or nitride. In some embodiments, the insulating material 104 may be an interlayer dielectric (ILD), such as undoped silicon oxide, doped silicon oxide (e.g., borophosphosilicate glass (BPSG) or phosphosilicate glass (PSG)), silicon nitride, silicon oxynitride, or any combination. A semiconductor body 102 may be disposed on the insulating material 104 so that the insulating material 104 insulates the semiconductor body 102 from the electrical element 106. In FIGS. 2-11, the semiconductor body 102 is shaped as a fin, but this is simply for ease of illustration, and the semiconductor body 102 may take other forms. For example, in some embodiments, the semiconductor body 102 may include one or more nanowires (e.g., when the transistor 150 is an all-around gate transistor). Insulating material 109 may be located at either "end" of the semiconductor body 102; the insulating material 109 may take the form of any of the embodiments of the insulating material 104 discussed herein.

The semiconductor body 102 may include any suitable semiconductor material or combination of materials, such as silicon, germanium, silicon germanium, gallium arsenide, indium antimonide, gallium phosphide, gallium antimonide, indium aluminum arsenide, indium gallium arsenide, gallium antimony phosphide, gallium arsenic antimonide, and/or indium. In some particular embodiments, the semiconductor body 102 may include an undoped lattice-stressed single crystalline semiconductor material having a carrier mobility greater than single crystalline silicon. In some particular embodiments, the semiconductor body 102 may be a doped single crystalline semiconductor material (such as doped single crystalline silicon). Lattice stress in at least some of the semiconductor body 102 may enhance carrier mobility and improve device performance. In some embodiments, the semiconductor body 102 may be compressively stressed for enhanced hole mobility in p-type devices, and may be tensilely stressed for enhanced electron mobility in n-type devices.

An insulating material 110 may be disposed on either face of the semiconductor body 102. In some embodiments, the insulating material 110 may be a shallow trench isolation (STI) material, such as silicon oxide, silicon nitride, silicon oxynitride, a low-k dielectric, yttrium oxide, scandium oxide, erbium oxide, lanthanum oxide, hafnium oxide, titanium oxide, indium gallium oxide, indium oxide, gallium oxide, tantalum oxide, germanium oxide, silicon germanium oxide, any combination thereof, and/or any appropriate dielectric material. As illustrated in FIG. 2, the insulating material 110 may extend between the semiconductor body 102 and parallel isolation walls 108 (also referred to as "etch walls"). The isolation walls 108 may be formed of any suitable insulating material, such as any of the materials discussed above with reference to the insulating material 110. In some embodiments, the isolation walls 108 may not be included in the assembly of FIG. 2.

FIG. 3 illustrates an assembly subsequent to forming a sacrificial gate 144 on the semiconductor body 102 of the assembly of FIG. 2. The sacrificial gate 144 may include a sacrificial gate electrode 112 and a sacrificial gate dielectric 114 disposed between the sacrificial gate electrode 112 and the semiconductor body 102. As illustrated in FIGS. 3B and 3C, when the semiconductor body 102 has a fin shape, the sacrificial gate 144 may extend over the top face of the semiconductor body 102 and at least partially down the side faces of the semiconductor body 102. In some embodiments, a hardmask 116 may be disposed on the sacrificial gate electrode 112. In some embodiments, the sacrificial gate dielectric 114 may be deposited to a thickness between 10 angstroms and 50 angstroms. The sacrificial gate dielectric 114 may serve as an etch stop layer during the patterning and formation of the sacrificial gate electrode 112, thereby mitigating damage to the semiconductor body 102. In some embodiments, the sacrificial gate dielectric 114 and the sacrificial gate electrode 112 may be formed from materials that have sufficiently different etch selectivity so that the sacrificial gate dielectric 114 may serve as an etch stop layer for etching the sacrificial gate electrode 112 to form the sacrificial gate 144. In a particular embodiment, the sacrificial gate dielectric 114 may be a dielectric layer (e.g., silicon oxide, silicon nitride, and silicon oxynitride) and the sacrificial gate electrode 112 may be a semiconductor material (e.g., polycrystalline silicon). In some embodiments, the sacrificial gate 144 (and the final gate 152, discussed below) may have a width 163 between 5 nanometers and 100 nanometers.

Figure 4A:
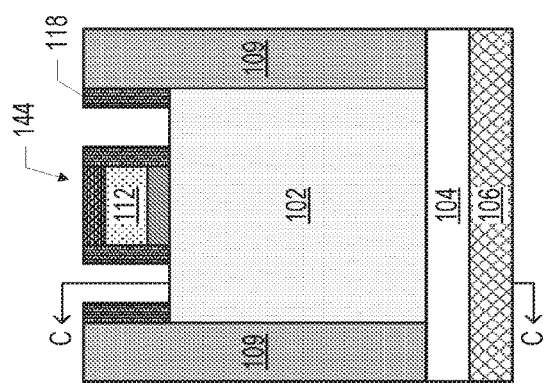
Figure 4C:
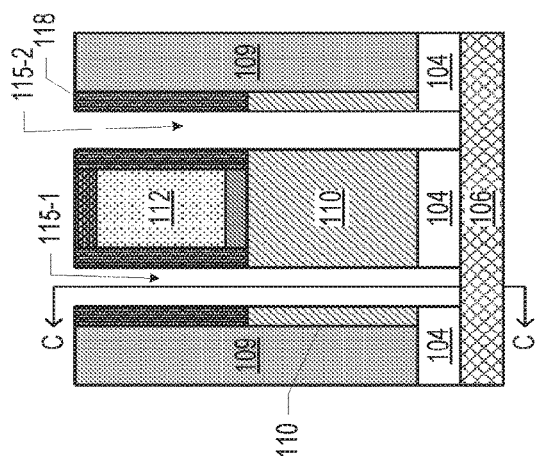

FIG. 4 illustrates an assembly subsequent to providing spacers 118 on side (e.g., vertical) faces of the elements of the assembly of FIG. 3. In particular, the spacers 118 may be provided on the side faces of the sacrificial gate 144 and the side faces of the semiconductor body 102. The spacers 118 may take the form of any of the sidewall spacers discussed below with reference to FIG. 40.

Figure 5A:
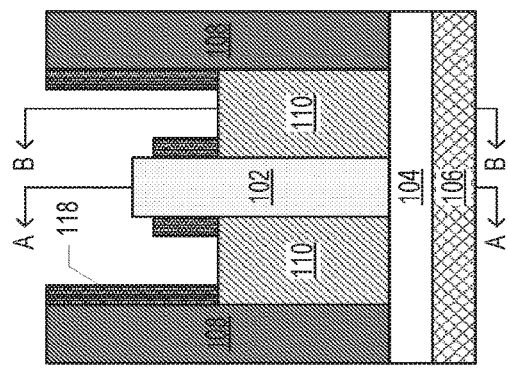
Figure 5B:
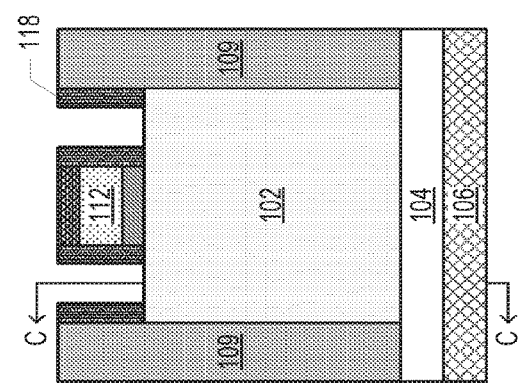
Figure 5C:
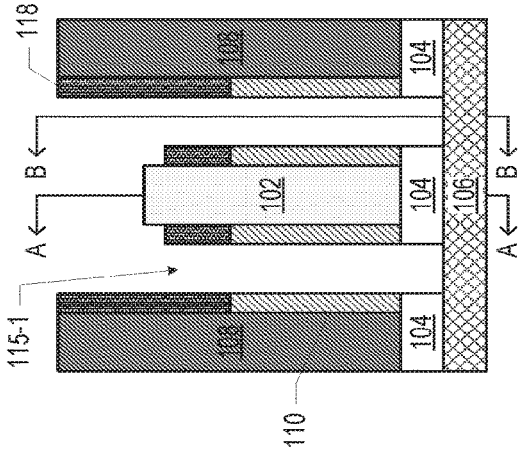

FIG. 5 illustrates an assembly subsequent to forming recesses 115 proximate to the longitudinal ends of the semiconductor body 102 of the assembly of FIG. 4. In particular, a pair of recesses 115-1 may be formed proximate to the side faces of the semiconductor body 102 at one longitudinal end of the semiconductor body 102, and a pair of recesses 115-2 may be formed proximate to the side faces of the semiconductor body 102 at the opposite longitudinal end of the semiconductor body 102. The recesses 115 may extend through the insulating material 104 to expose different portions of a top surface of the electrical element 106. The recesses 115 may be formed using any conventional lithographic and etching techniques. Note that the electrical element 106 illustrated in various ones of the drawings herein may not be a uniform conductive material, and instead, may include different regions of conductivity and insulation as desired. Thus, for example, the different portions of the top surface of the electrical element 106 exposed by the recesses 115 may not necessarily be "shorted" together within the electrical element 106, and may instead be associated with different conductive pathways within the electrical element 106. The recesses 115 may be spaced apart from the semiconductor body 102 by portions of the insulating material 110 and spacers 118. Similarly, the recesses 115 may be spaced apart from the isolation walls 108 and the insulating material 109 by portions of the insulating material 110 and spacers 118, as shown.

FIG. 6 illustrates an assembly subsequent to recessing portions of the semiconductor body 102 to form recesses 119 at the longitudinal ends of the semiconductor body 102 of the assembly of FIG. 5. Any suitable etching technique may be used to recess the semiconductor body 102.

FIG. 7 illustrates an assembly subsequent to providing metal 120 in the recesses 115 of the assembly of FIG. 6. The metal 120 may be disposed on the previously exposed portions of the top surface of the electrical element 106. The metal 120 may take the form of any of the embodiments disclosed herein, and may be deposited using any suitable technique (e.g., blanket deposition, followed by chemical mechanical polishing (CMP) to planarized, followed by recessing). In some embodiments, the metal 120 may have a height 123 between 20 nanometers and 100 nanometers.

FIG. 8 illustrates an assembly subsequent to growing a semiconductor material 122 on the exposed top surface of the semiconductor body 102 (including in the recesses 119) and the exposed top surface of the metal 120 of the assembly of FIG. 7. The metal 120 may provide a conductive pathway between the semiconductor material 122 and the associated portions of the top surface of the electrical element 106. The semiconductor material 122, the metal 120, and the electrical element 106 of the assembly of FIG. 8 (and FIGS. 9-11) may form IC contact structures 100, as discussed above with reference to FIG. 1. In some embodiments, the semiconductor material 122 may have a height 121 between 10 nanometers and 80 nanometers.

The semiconductor material 122 may take the form of any of the embodiments disclosed herein. In some embodiments, the portions of the semiconductor material 122 grown on the metal 120 may be polycrystalline, while the portions grown on the semiconductor body 102 (which may have a substantially crystalline structure) may be crystalline. Thus, the semiconductor material 122 may not have a homogeneous structural composition. The semiconductor material 122 may provide the S/D regions of a transistor, as discussed below.

In some embodiments, the semiconductor material 122 may be grown by epitaxy (e.g., using low-pressure chemical vapor deposition (CVD), vapor phase epitaxy, or molecular beam epitaxy). In some embodiments, the epitaxially deposited semiconductor material 122 may be doped in situ with dopants such as boron, arsenic, or phosphorous. For example, growth of the semiconductor material 122 may include deposition of the semiconductor material 122 (e.g., silicon germanium) in a hot wall reactor with the dopant (e.g., boron) present in a carrier gas.

In some embodiments, the use of regions of epitaxial semiconductor material 122 may improve performance by providing anchors to the semiconductor body 102 that help maintain the uniaxial stress in the semiconductor body 102 already present from earlier fabrication processes, such as fin patterning. In some embodiments, the semiconductor material 122 may be stressed and, thus, may further stress the adjacent semiconductor body 102. The stress in the semiconductor body 102 may be further enhanced by using a material for the semiconductor material 122 that has a different lattice constant than the material used to form the semiconductor body 102 (e.g., different semiconductor materials).

FIG. 9 illustrates an assembly subsequent to providing additional spacers 124 on side (e.g., vertical) faces of the elements of the assembly of FIG. 8. The additional spacers 124 may be provided in accordance with any of the embodiments discussed above with reference to the spacers 118 of FIG. 5. In some embodiments, the additional spacers 124 may not be provided.

FIG. 10 illustrates an assembly subsequent to removing the sacrificial gate 144 (and the hardmask 116) from the assembly of FIG. 9 and forming a gate 152 in its place. The gate 152 may include a gate dielectric 140 and a gate electrode 142. The gate dielectric 140 may be disposed between the gate electrode 142 and the semiconductor body 102. The gate dielectric 140 may take the form of any of the gate dielectric layers discussed below with reference to the gate 2442 of the transistor 2440 of FIG. 40, and the gate electrode 142 may take the form of any of the gate electrode layers discussed below with reference to the gate 2442 of the transistor 2440 of FIG. 40.

In some embodiments, the deposition of the gate dielectric 140 may be conformal (e.g., via atomic layer deposition (ALD)), and thus the gate dielectric 140 may both be disposed on the semiconductor body 102 and on the sides of the spacers 118, as shown in FIGS. 10B and 10C. In some embodiments, the gate dielectric 140 may have a thickness between 10 angstroms and 60 angstroms. In a specific embodiment, the gate dielectric 140 includes HfO$_2$ and has a thickness between 1 nanometer and 6 nanometers.

The gate electrode 142 may be formed of any suitable gate electrode material. For example, in some embodiments, the gate electrode 142 may include a superconducting material. In some embodiments, the gate electrode 142 may include a metal such as, but not limited to, Ti, TiN, TaN, W, Ru, TiAl, or any combination thereof. In some embodiments, the gate electrode 142 may be formed from a material having a work function between 3.9 eV and 4.2 eV. In some embodiments, the gate electrode 142 may be formed from a material having a work function between 4.8 eV and 5.2 eV. In some embodiments in which the semiconductor body 102 is undoped or very lightly doped, the gate electrode 142 may be formed from a material having a mid-gap work function between 4.3 eV and 4.7 eV.

The assembly of FIG. 10 may thus include a transistor 150 having S/D regions provided by the semiconductor material 122, a channel provided by the semiconductor body 102 between the portions of the semiconductor material 122, and a gate provided by the gate 152. The metal 120 may provide contacts from the S/D regions to the electrical element 106 below the transistor 150 (and as discussed above, may be part of an IC contact structure 100).

FIG. 11 illustrates an assembly subsequent to providing conductive material 126 on the semiconductor material 122 (between the additional spacers 124) of the assembly of FIG. 10. The conductive material 126 may include any suitable conductive material, such as any of the embodiments of the metal 120 discussed herein. The conductive material 126 may provide a contact to the semiconductor material 122 (and thus to the S/D regions of the transistor 150) from above the transistor 150 (in contrast to the IC contact structure 100, which provides a contact to the electrical element 106 below the transistor 150). In some embodiments, the conductive material 126 may not be present, and thus no conductive contact to the semiconductor material 122 above the transistor 150 may be made (instead, an insulating material may be provided).

FIGS. 12-14 are cross-sectional views of various stages in the manufacture of an assembly including a transistor 150 and another IC contact structure 100 in accordance with FIG. 1. The manufacturing operations illustrated in FIGS. 12-14 begin with the assembly of FIG. 7 (discussed above). In particular, the "A" sub-figures of FIGS. 12-14 are cross-sectional views across a semiconductor body 102 (taken along the section C-C of the "B" and "C" sub-figures), the "B" sub-figures of FIGS. 12-14 are cross-sectional views along the semiconductor body 102 (taken along the section A-A of the "A" sub-figures), and the "C" sub-figures of FIGS. 12-14 are cross-sectional views offset from the semiconductor body 102 (taken along the section B-B of the "A" sub-figures).

FIG. 12 illustrates an assembly subsequent to growing a semiconductor material 122 on the exposed top surface of the semiconductor body 102 (including in the recesses 119) and the exposed top surface of the metal 120 of the assembly of FIG. 7. In contrast to the assembly of FIG. 8, the semiconductor material 122 of the assembly of FIG. 12 does not extend all the way out to the spacers 118 on the isolation walls 108, but instead extends over the metal 120 while stopping short of reaching the spacers 118 on the isolation walls 108. In the assembly of FIG. 12, the metal 120 may provide a conductive pathway between the semiconductor material 122 and the associated portions of the top surface of the electrical element 106. The semiconductor material 122, the metal 120, and the electrical element 106 of the assembly of FIG. 12 (and FIGS. 13-14) may form IC contact structures 100, as discussed above with reference to FIG. 1. The semiconductor material 122 of FIG. 12 may take the form of any of the embodiments of the semiconductor material 122 discussed herein (e.g., as discussed above with reference to FIG. 8). The assembly of FIG. 12 may be formed by providing a sacrificial material (not shown) along the outer sidewall spacers 118 of the assembly of FIG. 7, grow the semiconductor material 122, and then remove the sacrificial material, resulting in the assembly of FIG. 12. In some embodiments, the sacrificial material may be initially conformally deposited, then removed from everywhere but the outer sidewall spacers 118 (to expose the top surface of the semiconductor body 102 and the top surface of the metal 120 of the assembly of FIG. 7) with or without a patterning step. If the geometry of the assembly of FIG. 7 is amenable to spacer-like self-aligned sidewall coverage, then no patterning of the sacrificial material may be needed. If the geometry of the central topography of the assembly of FIG. 7 is too "tall" for a spacer-like process, then the "central" portion of the sacrificial material may be masked, patterned, and etched before growth of the semiconductor material 122.

FIG. 13 illustrates an assembly subsequent to providing additional spacers 124 on side (e.g., vertical) faces of the elements of the assembly of FIG. 12. The additional spacers 124 of FIG. 13 may take the form of any of the embodiments of the additional spacers 124 of FIG. 9. In some embodiments, the additional spacers 124 may not be provided.

FIG. 14 illustrates an assembly subsequent to removing the sacrificial gate 144 (and the hardmask 116) from the assembly of FIG. 13, forming a gate 152 (including a gate dielectric 140 and a gate electrode 142) in its place, and providing conductive material 126 on the semiconductor material 122 (between the additional spacers 124). The gate dielectric 140, the gate electrode 142, and the conductive material 126 may take the form of any of the embodiments disclosed herein (e.g., discussed above with reference to FIGS. 10 and 11). The assembly of FIG. 14 may thus include a transistor 150 having S/D regions provided by the semiconductor material 122, a channel provided by the semiconductor body 102 between the portions of the semiconductor material 122, and a gate provided by the gate 152. The metal 120 may provide contacts from the S/D regions to the electrical element 106 below the transistor 150 (and as discussed above, may be part of an IC contact structure 100). The conductive material 126 may provide further conductive material between the semiconductor material 122 and the metal 120. In some embodiments, the conductive material 126 may provide a conductive contact to the semiconductor material 122 above the transistor 150. In other embodiments, when the conductive material 126 is not to provide an "above" contact to the transistor 150, an insulating material (not shown) may be disposed on top of the conductive material 126.

FIGS. 15-20 are cross-sectional views of various stages in the manufacture of an assembly including a transistor 150 and another IC contact structure 100 in accordance with FIG. 1. Like the manufacturing operations discussed above with reference to FIGS. 12-14, the manufacturing operations illustrated in FIGS. 15-20 also begin with the assembly of FIG. 7 (discussed above). The "A" sub-figures of FIGS. 15-20 are cross-sectional views across a semiconductor body 102 (taken along the section C-C of the "B" and "C" sub-figures), the "B" sub-figures of FIGS. 15-20 are cross-sectional views along the semiconductor body 102 (taken along the section A-A of the "A" sub-figures), and the "C" sub-figures of FIGS. 15-20 are cross-sectional views offset from the semiconductor body 102 (taken along the section B-B of the "A" sub-figures).

Figure 15A:
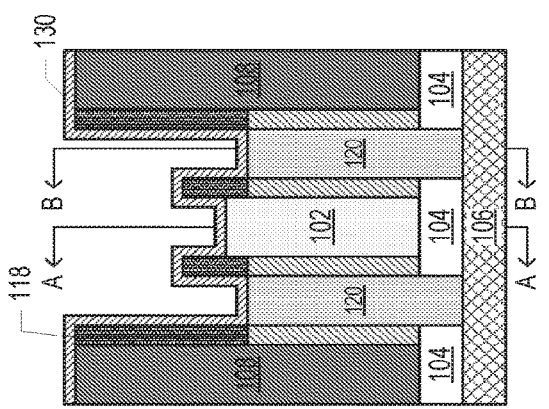
Figure 15B:
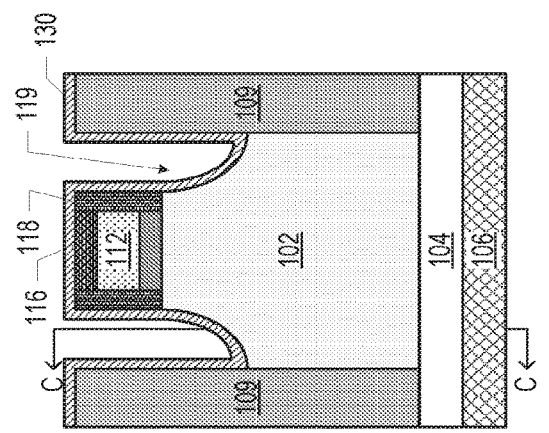
Figure 15C:
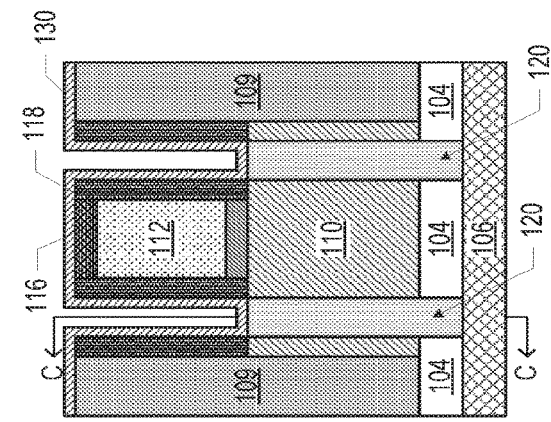

FIG. 15 illustrates an assembly subsequent to providing a conformal layer of semiconductor material 130 on the assembly of FIG. 7. The semiconductor material 130 may be disposed over the semiconductor body 102 (e.g., in the recesses 119), and over the metal 120, as shown. In some embodiments, the conformal layer of semiconductor material 130 may be grown using non-selective epitaxy, employing precursors with weaker bonds than used for selective growth. For example, in some embodiments, silicon, germanium, silicon-germanium alloys, and many III-V materials may be grown non-selectively with precursors that have a relatively higher proportion of weaker silicon-silicon bonds and a relatively lower proportion of stronger silicon-hydrogen bonds (e.g., disilane, trisilane and tetrasilane), as understood in the art. Across a number of semiconductor materials, increasing non-selectivity may be achieved by utilizing precursors with greater molecular weights. In some embodiments, the conformal layer of semiconductor material 130 may have a thickness between 1 and 50 nanometers (e.g., between 2 and 30 nanometers).

Figure 16A:
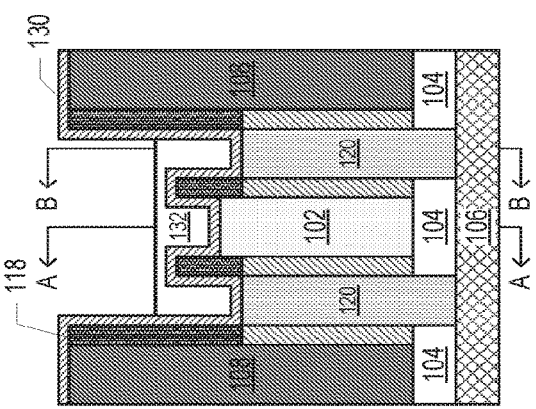
Figure 16B:
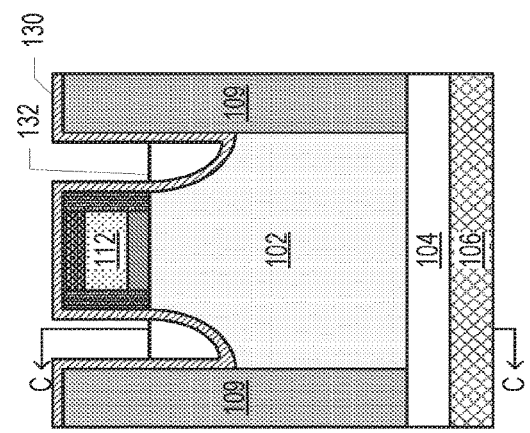
Figure 16C:
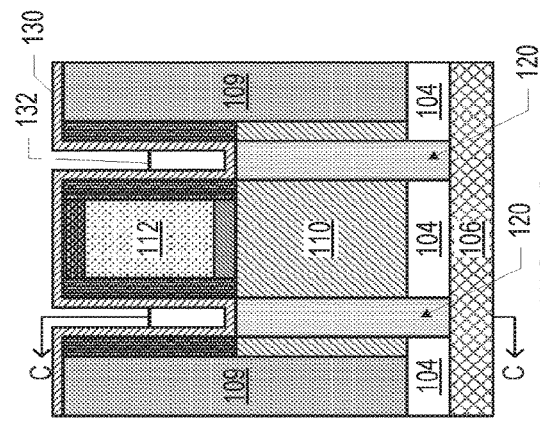

FIG. 16 illustrates an assembly subsequent to providing a sacrificial material 132 on a portion of the semiconductor material 130 of the assembly of FIG. 15. In particular, the sacrificial material 132 may fill the recesses 119 in the semiconductor body 102 and may cover the portion of the semiconductor material 130 over the metal 120, the semiconductor body 102, and the intervening spacers 118 (as shown in FIG. 16A). The sacrificial material 132 may include any suitable material, such as a polymer, oxide, or sacrificial metal.

Figure 17A:
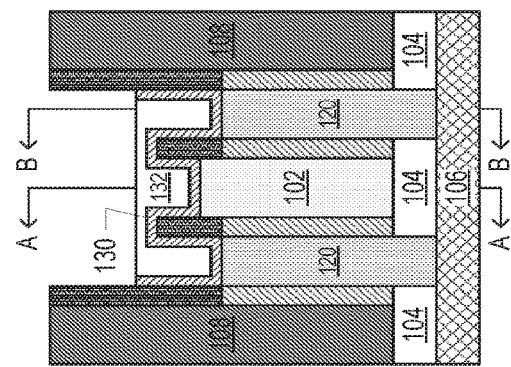
Figure 17B:
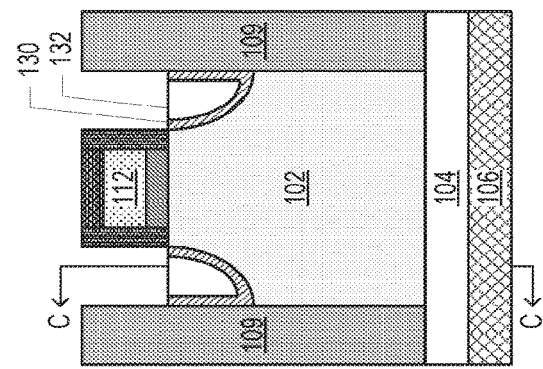
Figure 17C:
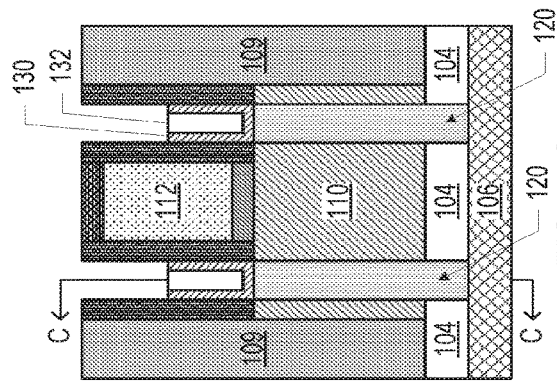

FIG. 17 illustrates an assembly subsequent to removing the semiconductor material 130 of the assembly of FIG. 16 that is not protected by the sacrificial material 132. In particular, the semiconductor material 130 on the sacrificial gate 144, on the top surfaces of the isolation walls 108, and on the top surfaces of the insulating material 109, may be removed. The exposed semiconductor material 130 may be removed using any suitable selective etch technique.

Figure 18A:
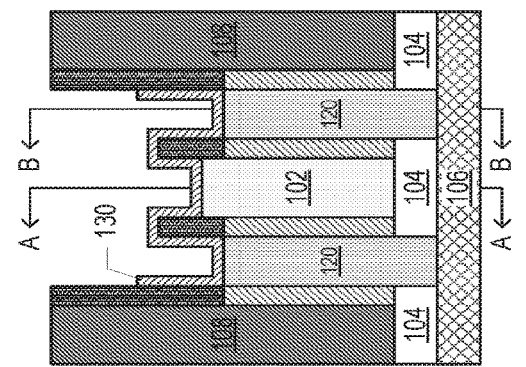
Figure 18B:
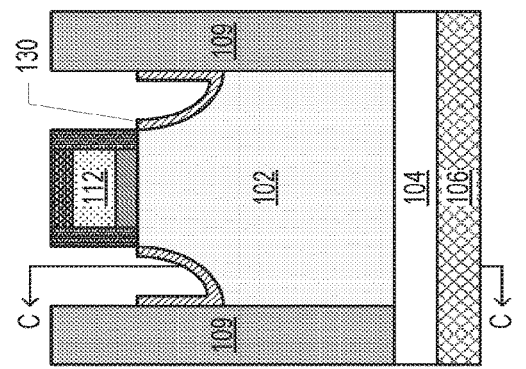
Figure 18C:
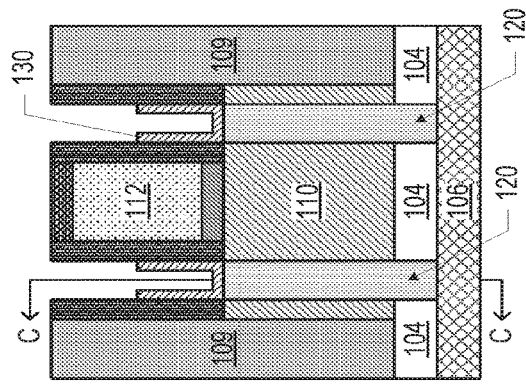

FIG. 18 illustrates an assembly subsequent to removing the sacrificial material 132 of the assembly of FIG. 17, using any suitable selective etch technique. The semiconductor material 130 may remain.

FIG. 19 illustrates an assembly subsequent to growing a semiconductor material 134 on the semiconductor material 130 of the assembly of FIG. 18. The semiconductor material 134 may be grown using any suitable epitaxial method (e.g., any of the methods disclosed herein), with the semiconductor material 130 serving as a seed layer for the growth of the semiconductor material 134. The semiconductor material 134 may at least partially fill the recesses 119 in the semiconductor body 102, and may extend over the metal 120 and the intervening semiconductor body 102 (as shown in FIG. 19). Together, the semiconductor material 134 and the semiconductor material 130 may provide the semiconductor material 122. The semiconductor material 122, the metal 120, and the electrical element 106 of the assembly of FIG. 19 (and FIG. 20) may form IC contact structures 100, as discussed above with reference to FIG. 1.

FIG. 20 illustrates an assembly subsequent to forming additional spacers 124, removing the sacrificial gate 144 (and the hardmask 116) from the assembly of FIG. 19, forming a gate 152 (including a gate dielectric 140 and a gate electrode 142) in its place, and providing conductive material 126 on the semiconductor material 122 (between the additional spacers 124). The additional spacers 124, the gate dielectric 140, the gate electrode 142, and the conductive material 126 may take the form of any of the embodiments disclosed herein (e.g., discussed above with reference to FIGS. 9-11). The assembly of FIG. 20 may thus include a transistor 150 having S/D regions provided by the semiconductor material 122, a channel provided by the semiconductor body 102 between the portions of the semiconductor material 122, and a gate provided by the gate 152. The metal 120 may provide contacts from the S/D regions to the electrical element 106 below the transistor 150 (and as discussed above, may be part of an IC contact structure 100). In some embodiments, the conductive material 126 may provide a conductive contact to the semiconductor material 122 above the transistor 150. In other embodiments, the conductive material 126 may be omitted.

Figure 21:
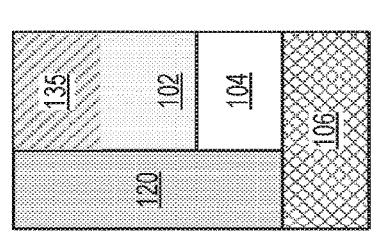
FIG. 21 is a cross-sectional view of another IC contact structure, in accordance with various embodiments.

FIG. 21 is a cross-sectional view of an IC contact structure 200, in accordance with various embodiments. The IC contact structure 200 may include an electrical element 106, a semiconductor body 102 having a doped portion 135, an insulating material 104 between the electrical element 106 and the semiconductor body 102, and a metal 120 that conductively couples the electrical element 106 and the doped portion 135. Although the electrical element 106, the insulating material 104, the semiconductor body 102, and the metal 120 are shown in a particular geometric relationship in FIG. 21, this is simply for ease of illustration, and the metal 120 may provide a conductive pathway between the doped portion 135 of the semiconductor body 102 and the electrical element 106 using any particular geometry of the IC contact structure 200.

The electrical element 106, the insulating material 104, and the semiconductor body 102 of the IC contact structure 200 may take the form of any of the embodiments disclosed herein (e.g., as discussed above with reference to FIG. 1). The semiconductor body 102 may be, for example, a fin or one or more nanowires.

The doped portion 135 may be formed by implanting dopants such as boron, aluminum, antimony, phosphorous, or arsenic into the semiconductor body 102. An annealing process that activates the dopants and causes them to diffuse farther into the semiconductor body 102 may follow the implantation process.

In some embodiments, the doped portion 135 and the remainder of the semiconductor body 102 may not be strained. In some such embodiments, the doped portion 135 may provide the S/D of an n-type metal oxide semiconductor (NMOS) transistor, while a portion of the semiconductor body 102 provides the channel of the NMOS transistor (e.g., as discussed below with reference to FIGS. 22-24). In other embodiments, strain may be imparted to the semiconductor body 102 (to improve mobility as discussed above) using any suitable technique.

Figure 22A:
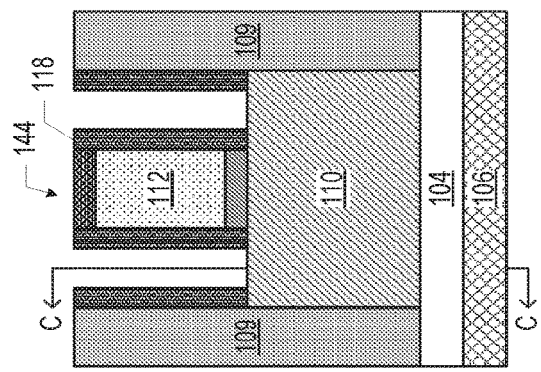
FIGS. 22A-22C, 23A-23C, and 24A-24C are cross-sectional views of various stages in the manufacture of an assembly including a transistor and another IC contact structure in accordance with FIG. 21.
Figure 22B:
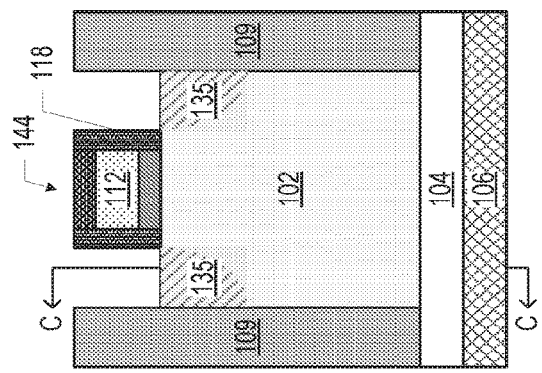
Figure 22C:
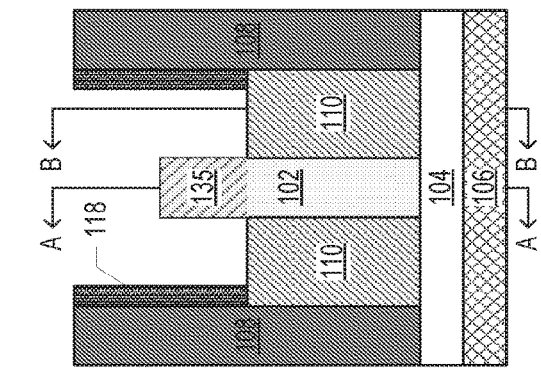
Figure 23A:
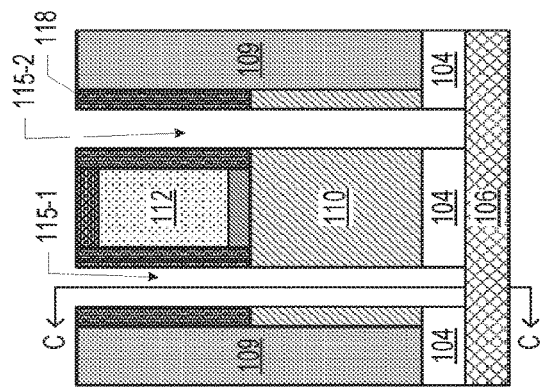
Figure 23B:
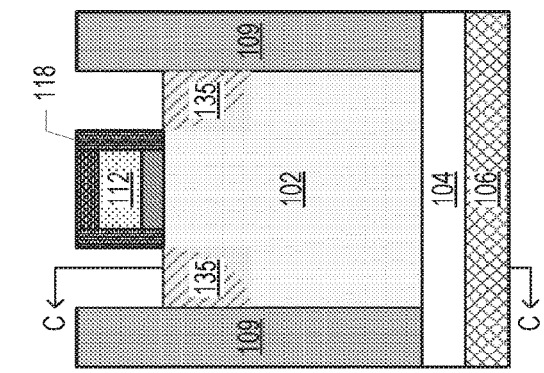
Figure 23C:
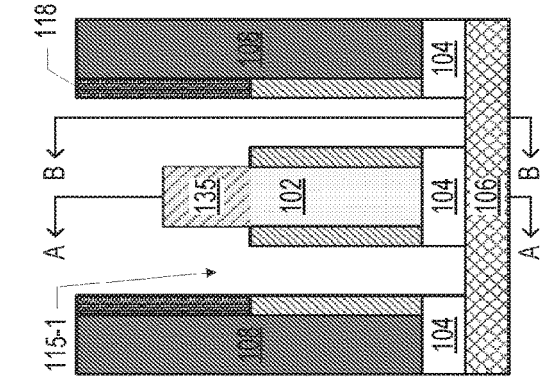
Figure 24C:
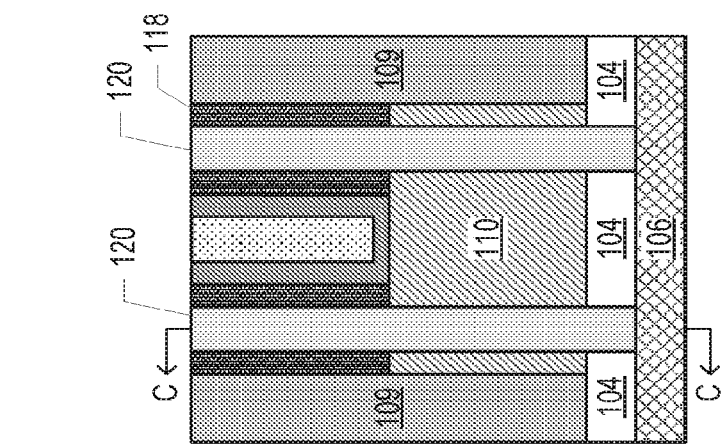
Figure 24B:
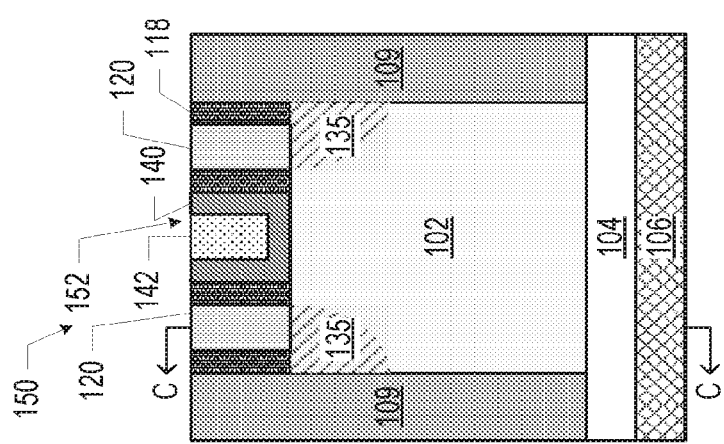
Figure 24A:
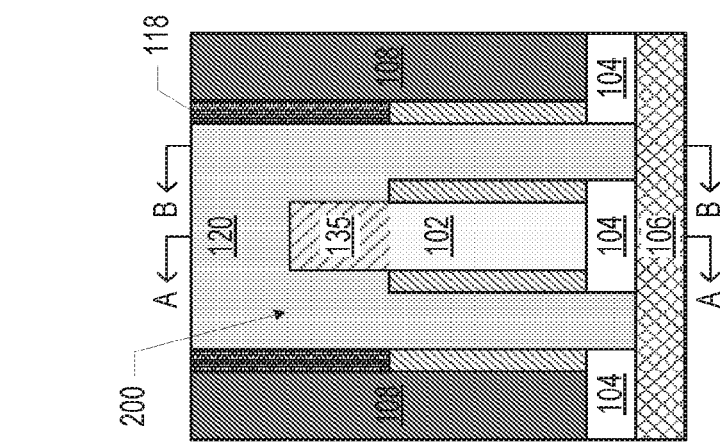

The IC contact structure 200 of FIG. 21 may be implemented in any suitable manner, and a number of examples are discussed below with reference to FIGS. 22-24. In particular, FIGS. 22-24 are cross-sectional views of various stages in the manufacture of an assembly including a transistor 150 having an IC contact structure 200 in accordance with FIG. 21. The manufacturing operations illustrated in FIGS. 22-24 begin with the assembly of FIG. 4 (discussed above). The "A" sub-figures of FIGS. 22-24 are cross-sectional views across a semiconductor body 102 (taken along the section C-C of the "B" and "C" sub-figures), the "B" sub-figures of FIGS. 22-24 are cross-sectional views along the semiconductor body 102 (taken along the section A-A of the "A" sub-figures), and the "C" sub-figures of FIGS. 22-24 are cross-sectional views offset from the semiconductor body 102 (taken along the section B-B of the "A" sub-figures).

FIG. 22 illustrates an assembly subsequent to removing the spacers 118 on side faces of the semiconductor body 102 of the assembly of FIG. 4, and doping regions at the longitudinal ends of the semiconductor body 102 (e.g., using ion implantation) to form doped portions 135. In some embodiments, the spacers 118 on side faces of the sacrificial gates 144 may act as doping barriers to constrain the doping to the portions of the semiconductor body 102 to the regions not under the sacrificial gates 144 or adjacent spacers 118.

FIG. 23 illustrates an assembly subsequent to forming recesses 115 in the assembly of FIG. 22. The recesses 115 may take the form of the recesses 115 discussed above with reference to FIG. 5, and may expose portions of the top surface of the electrical element 106.

FIG. 24 illustrates an assembly subsequent to providing a metal 120 in the recesses 115 of the assembly of FIG. 23, removing the sacrificial gate 144 (and the hardmask 116) from the assembly of FIG. 19, and forming a gate 152 (including a gate dielectric 140 and a gate electrode 142) in its place. The gate dielectric 140, the gate electrode 142, and the metal 120 may take the form of any of the embodiments disclosed herein (e.g., discussed above with reference to FIGS. 7 and 11). The metal 120 may extend over the doped portions 135, and thus may provide a conductive pathway between the doped portions 135 and the portions of the top surface of the electrical element 106 in contact with the metal 120. The electrical element 106, the insulating material 104, the doped portions 135 of the semiconductor body 102, the semiconductor material 122, and the metal 120 of the assembly of FIG. 24 may form IC contact structures 200, as discussed above with reference to FIG. 21. The assembly of FIG. 24 may thus include a transistor 150 having S/D regions provided by the doped portions 135, a channel provided by the semiconductor body 102 between the doped portions 135, and a gate provided by the gate 152. The metal 120 may provide contacts from the S/D regions to the electrical element 106 below the transistor 150 (and as discussed above, may be part of an IC contact structure 200). In some embodiments, the metal 120 may provide a conductive contact to the doped portions 135 above the transistor 150. In other embodiments, when the metal 120 is not to provide an "above" contact to the transistor 150, an insulating material (not shown) may be disposed on top of the metal 120 of FIG. 24.

The IC contact structures 100 and 200 disclosed herein may be used in any suitable manner in an IC device. In particular, the IC contact structures 100 and 200 may be used to provide a "vertical" conductive contact within an IC device, reducing the footprint of the device relative to contact structures with a larger lateral footprint. For example, FIGS. 25-36 are cross-sectional views of various stages in the manufacture of an inverter circuit element including IC contact structures 100 in accordance with FIG. 1. The technique illustrated with reference to FIGS. 25-36 may be applied to the manufacture of any circuit element (e.g., a pass gate, other logic element, or any other arrangement of transistors). The "A" sub-figures of FIGS. 25-36 are cross-sectional views along a semiconductor body 102 (taken along the section B-B of the "B" and "C" sub-figures), the "B" sub-figures of FIGS. 25-36 are cross-sectional views across the semiconductor body 102 (taken along the section A-A of the "A" sub-figures), and the "C" sub-figures of FIGS. 25-36 are cross-sectional views across the semiconductor body 102 (taken along the section C-C of the "A" sub-figures).

Figure 25A:
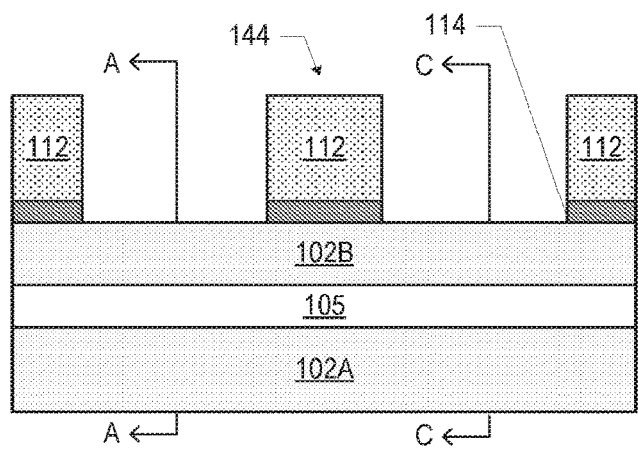
Figures 25B, 25C:
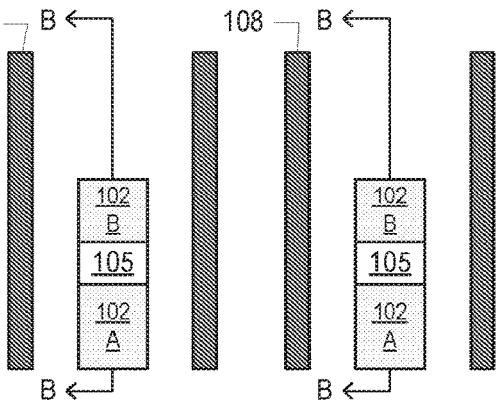

FIG. 25 illustrates an assembly including a semiconductor body 102 having a lower portion 102A and an upper portion 102B. The semiconductor body 102 may be shaped as a fin, as discussed above. The lower portion 102A is separated from the upper portion 102B by a layer 105. The layer 105 may be a sacrificial epitaxial layer (e.g., silicon germanium with a high germanium content), a crystalline insulator (e.g., yttria-stabilized zirconia (YSZ)), or any other suitable material. Isolation walls 108 may segregate multiple semiconductor bodies 102.

A plurality of sacrificial gates 144 may be formed over the semiconductor body 102, with source/drain locations between each of the plurality of sacrificial gates 144, as discussed below. Each of the plurality of sacrificial gates 144 may include a sacrificial gate dielectric 114 and a sacrificial gate electrode 112, as depicted in FIG. 25.

The formation of the semiconductor body 102 may begin with a starting structure of blanket layers that is then etched to provide a fin structure. A shallow trench isolation oxide may be formed adjacent to lower regions of the etched fin stack. The plurality of sacrificial gates 144 may form a grid pattern into and out of the page relative to the perspective of FIG. 25A, and the patterning may involve pitch halving or pitch quartering patterning. Additionally, it is to be appreciated that the plurality of sacrificial gates 144 extends from the top of the upper portion 102B of the semiconductor body 102 (as shown) and further wraps the upper portion 102B, the lower portion 102A (e.g., as discussed above with reference to FIGS. 2-20), and the layer 105 of the semiconductor body 102 at locations into and out of the page with respect to the perspective of FIG. 25A.

Figure 26A:
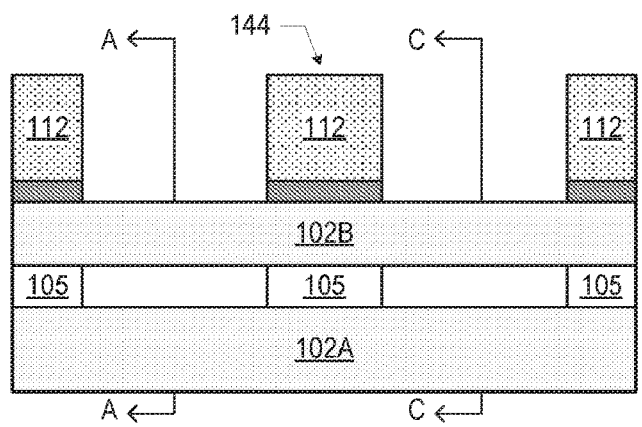
Figures 26B, 26C:
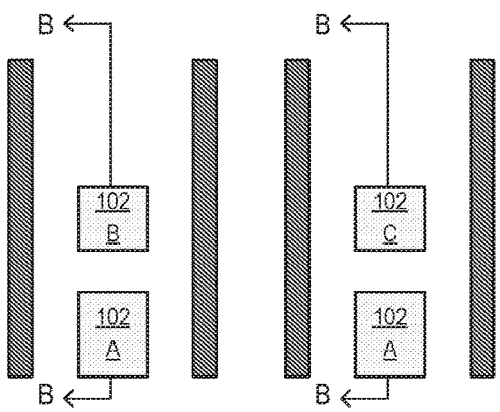

FIG. 26 illustrates an assembly subsequent to removing portions of the layer 105 of the semiconductor body 102 of the assembly of FIG. 25. The removed regions are those laterally "between" the sacrificial gates 144, and may correspond with source/drain locations, as discussed below. The regions of the layer 105 of the semiconductor body 102 may be removed using an etch process selective against etching of the material of the portions 102A and 102B of the semiconductor body 102. For example, when the upper portion 102B is formed of silicon germanium, the layer 105 may include silicon germanium having a higher germanium content than the silicon germanium of the upper portion 102B. In embodiments in which the layer 105 includes a crystalline insulator, the crystalline insulator may only be included in a layer 105 in regions that are not the removed regions; in the removed regions, the layer 105 may include a sacrificial epitaxial layer (e.g., silicon germanium with a high germanium content).

Figure 27A:
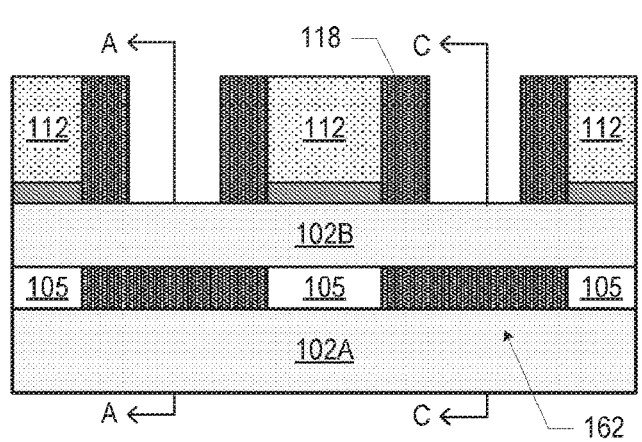
Figures 27B, 27C:
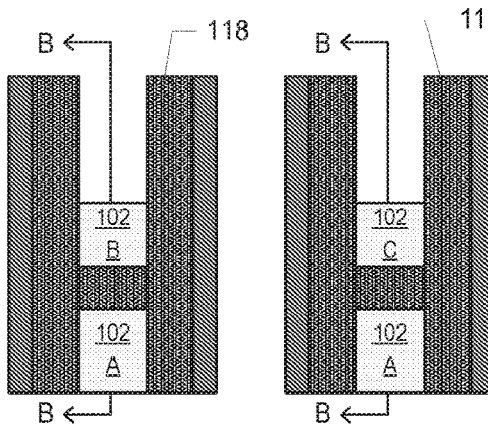

FIG. 27 illustrates an assembly subsequent to forming spacers 118 adjacent the sidewalls of each of the plurality of sacrificial gates 144 of the assembly of FIG. 26. As discussed above, the spacers 118 may be fabricated by first forming a conformal dielectric layer on the assembly of FIG. 26 and then anisotropically etching the conformal dielectric layer. In some embodiments, as illustrated in FIG. 27, the dielectric material of the spacers 118 may remain in the removed regions of the layer 105 to form dielectric regions 162.

FIG. 28 illustrates an assembly subsequent to performing a vertical undercut etch on the assembly of FIG. 27 to remove portions of the semiconductor body 102 from the source/drain locations to form recesses 138. Two recesses, 138-1 and 138-2, are shown in FIG. 28. The width of the undercut feature may depend on whether n-type or p-type semiconductor regions will ultimately be formed in the recesses 138.

FIG. 29 illustrates an assembly subsequent to providing epitaxial semiconductor material 164 in the recesses 138 of the assembly of FIG. 28. Two regions of epitaxial semiconductor material, 164-1 and 164-2, are shown in FIG. 28 in the recesses 138-1 and 138-2, respectively. The regions of epitaxial semiconductor material 164 may provide electrical elements 106 in IC contact structures 100, as discussed below. The epitaxial semiconductor material 164 may be n-type (such as n-type silicon) or p-type (such as p-type silicon germanium) regions, depending on the structural arrangement required. Epitaxial growth from semiconductor body 102 to semiconductor body 102 (e.g., fin to fin) may be restricted by the isolation walls 108, in some embodiments.

FIG. 30 illustrates an assembly subsequent to etching back the epitaxial semiconductor material 164 of the assembly of FIG. 29. The etched back epitaxial semiconductor material 164 (referred to subsequently as the "semiconductor material 164") may provide S/D regions for a lower transistor 150-1 that may act as the electrical element 106, as discussed below. In some embodiments, the semiconductor material 164 is formed to a height at or below the height of the lower portion 102A of the semiconductor body 102. In particular, the layer 105 may serve as a marker layer.

FIG. 31 illustrates an assembly subsequent to providing an insulating material 104 on the semiconductor material 164 of the assembly of FIG. 30. In some embodiments, the insulating material 104 may be an isolation oxide, and may be formed using an oxide fill, recess, and wet clean processing scheme. In some embodiments, the top of the insulating material 104 is approximately at the same level as the top of the layer 105 of the semiconductor body 102. The insulating material 104 may be ultimately used to isolate corresponding bottom and top transistors, as discussed below.

FIG. 32 illustrates an assembly subsequent to patterning the insulating material 104 of the assembly of FIG. 31 to remove portions of the insulating material 104 in the recess 138-1. In particular, portions of the insulating material 104 in the recess 138-1 near the isolation walls 108 may be removed to expose portions of a top surface of the semiconductor material 164-1. The portions of the insulating material 104 may be removed using any suitable etch technique. Note that the insulating material 104 in the recess 138-2 may not be removed in the illustrated embodiment.

FIG. 33 illustrates an assembly subsequent to providing a metal 120 around the insulating material 104 in the recess 138-1 of the assembly of FIG. 32. The metal 120 may take the form of any of the embodiments disclosed herein. In some embodiments, the metal 120 may be restricted to the sides of the insulating material 104 in the recess 138-1, while in other embodiments, the metal 120 may extend over the insulating material 104 (not shown). In some embodiments, metal 120 may also be provided on the insulating material 104 in the recess 138-2 (not shown).

FIG. 34 illustrates an assembly subsequent to providing semiconductor material 122 in the recesses 138 of the assembly of FIG. 33. In some embodiments, the semiconductor material 122 may be epitaxially grown on the metal 120/insulating material 104 in the recess 138-1, and on the insulating material 104 in the recess 138-2. The semiconductor material 122 of the assembly of FIG. 34 may take the form of any of the embodiments disclosed herein. The semiconductor material 122 may serve as S/D regions for an upper transistor, discussed further below. The semiconductor material 122, the metal 120, and the electrical elements 106 may provide IC contact structures 100.

FIG. 35 illustrates an assembly subsequent to performing a replacement gate process to remove the sacrificial gates 144 and replace them with upper gates 152 including a gate electrode 142 and a gate dielectric 140. This replacement gate process may take the form of any of the embodiments disclosed herein. A set of lower gates (not shown) may also be formed within the trench formed upon removal of the sacrificial gate 144, which may involve deposition and recessing of gate materials to a level approximately at the level of the lower portion 102A, on either side of the semiconductor body 102 (i.e., into and out of the page of the perspective shown in FIG. 35). The upper gates 152 may then be formed above the lower gates. In the case of the inverter structure of FIGS. 25-36, the upper gates 152 may be of an opposite conductivity type than that of the lower gates. When the operations discussed with reference to FIGS. 25-36 are modified to form a pass gate structure, for example, the upper gates 152 may be of a same conductivity type as that of the lower gates. In either case, within a same gate trench, an isolation layer (not shown) may be formed between the lower gate and the upper gates 152.

FIG. 36 illustrates an assembly subsequent to providing a conductive material 126 above the semiconductor material 122 of the assembly of FIG. 35. The conductive material 126 may act as a "top" contact to the S/D regions provided by the semiconductor material 122, and may take the form of any of the embodiments disclosed herein. The assembly of FIG. 36 may include a lower transistor 150-1, and an upper transistor 150-2. In the assembly of FIG. 36, the lower transistor 150-1 may be an NMOS device and the semiconductor material 164 is an n-type material, such as n-type silicon regions. The upper transistor 150-2 of the inverter structure of FIG. 36 may be a PMOS device and the semiconductor material 122 is a p-type material, such as p-type silicon germanium regions.

In other embodiments, the upper portion 102B may not be undercut with recesses 138 prior to provision of the semiconductor material 122, as was discussed above with reference to FIGS. 28 and 34. Instead, the portion of the semiconductor body 102 between the spacers 118 may be narrowed and implanted or in-diffused with a dopant. Subsequently, a metal 120 may be provided along side faces of the narrowed semiconductor body, forming IC contact structures 200 with the electrical elements 106 (instead of IC contact structures 100).

Figures 37, 38:
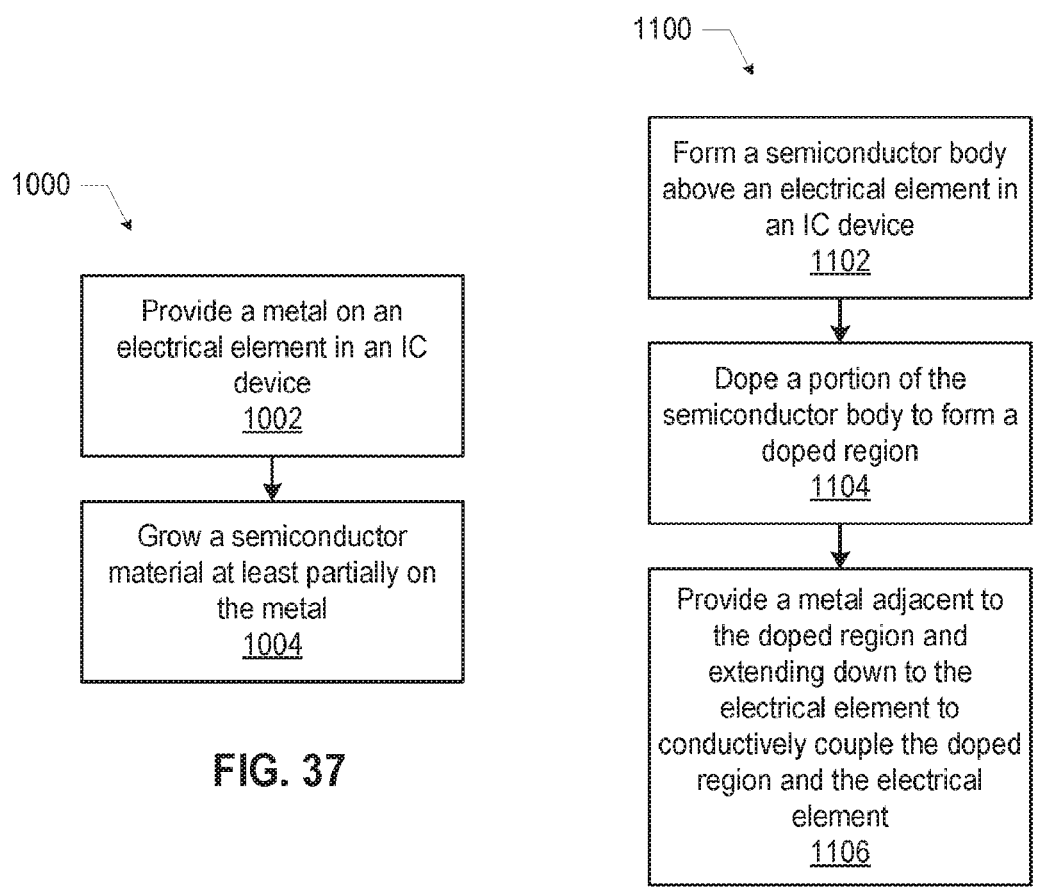
FIGS. 37 and 38 are flow diagrams of methods of manufacturing an IC contact structure, in accordance with various embodiments.

Any suitable techniques may be used to manufacture any of the assemblies (e.g., any of the IC contact structures) disclosed herein. FIGS. 37 and 38 are flow diagrams of methods 1000 and 1100, respectively, of manufacturing an IC contact structure, in accordance with various embodiments. Although various operations are arranged in particular order and illustrated once each in FIGS. 37 and 38, various ones of the operations may be repeated or performed in any suitable order. Additionally, although various operations of the methods of FIGS. 37 and 38 are illustrated with reference to particular ones of the embodiments disclosed herein, the methods of FIGS. 37 and 38 may be used to form any suitable IC contact structures.

Turning to the method 1000 of FIG. 37, at 1002, a metal may be provided on an electrical element in an IC device. For example, a metal 120 may be provided on an electrical element 106, in accordance with a number of the embodiments disclosed herein.

At 1004, a semiconductor material may be grown at least partially on the metal. For example, a semiconductor material 122 may be grown (e.g., by epitaxy) at least partially on the metal 120, in accordance with a number of the embodiments disclosed herein.

Turning to the method 1100 of FIG. 38, at 1102, a semiconductor body may be formed above an electrical element in an IC device. For example, a semiconductor body 102 may be formed above an electrical element 106, in accordance with a number of the embodiments disclosed herein.

At 1104, a portion of the semiconductor body may be doped to form a doped region. For example, a semiconductor body 102 may be doped to form doped portions 135 in the semiconductor body 102, in accordance with a number of the embodiments disclosed herein.

At 1106, a metal may be provided adjacent to the doped region and extending down to the electrical element. The metal may conductively couple the doped region and the electrical element. For example, a metal 120 may be provided adjacent to a doped portion 135 such that the metal 120 extends down to the electrical element 106 to conductively couple the doped portion 135 and the electrical element 106.

The IC contact structures disclosed herein may be included in any suitable IC device, which may in turn be included in any suitable computing device. FIGS. 39-42 illustrate various examples of apparatuses that may include any of the IC contact structures disclosed herein. Similarly, the methods disclosed herein may be used in any suitable stage in the manufacture of an apparatus, including any of the apparatuses discussed below with reference to FIGS. 39-42.

Figures 39A, 39B:
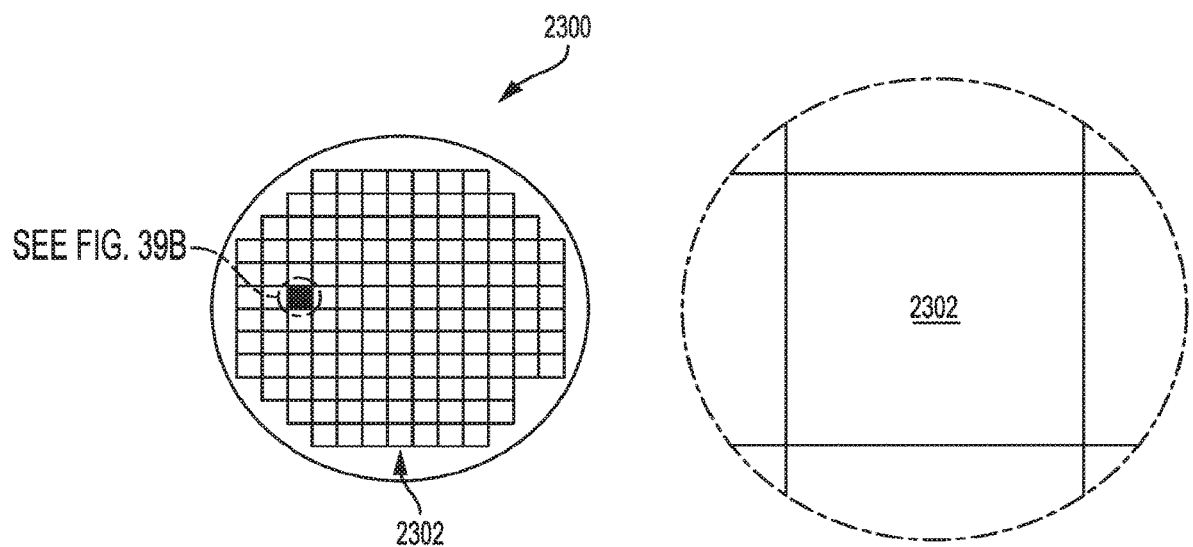
FIGS. 39A and 39B are top views of a wafer and dies that may include an IC contact structure in accordance with any of the embodiments disclosed herein.

FIGS. 39A-B are top views of a wafer 2300 and dies 2302 that may include one or more IC contact structures in accordance with any of the embodiments disclosed herein (e.g., the IC contact structures 100 or 200). An IC contact structure may be one of multiple IC structures formed on the wafer 2300. The wafer 2300 may be composed of semiconductor material and may include one or more dies 2302 having IC structures formed on a surface of the wafer 2300.

Each of the dies 2302 may be a repeating unit of a semiconductor product that includes one or more of the IC contact structures. After the fabrication of the semiconductor product is complete, the wafer 2300 may undergo a singulation process in which each of the dies 2302 is separated from one another to provide discrete "chips" of the semiconductor product. Thus, the IC contact structures may be present in the wafer 2300 due to its presence in the dies 2302. In particular, the IC contact structures may be included in an apparatus that takes the form of the wafer 2300 (e.g., not singulated) or the form of the die 2302 (e.g., singulated). As discussed above, the IC contact structures may be part of a multi-transistor structure included in the die 2302. In addition to the IC contact structures, and any associated transistors 150, the die 2302 may include one or more other transistors (e.g., some of the transistor(s) 2440 of FIG. 40, discussed below) and/or supporting circuitry to route electrical signals to the one or more multi-transistor structure, as well as any other IC components.

In some embodiments, an IC contact structure may be included in a memory device (e.g., a static random access memory (SRAM) device), a logic device (e.g., an AND, OR, NAND, or NOR gate), or any other suitable circuit element. Multiple ones of these devices may be combined on a single die 2302. For example, a memory array formed by multiple memory devices may be formed on a same die 2302 as a processing device (e.g., the processing device 2602 of FIG. 42) or other logic that is configured to store information in the memory devices or execute instructions stored in the memory array; any one or more of these devices may include one or more IC contact structures.

Figure 40:
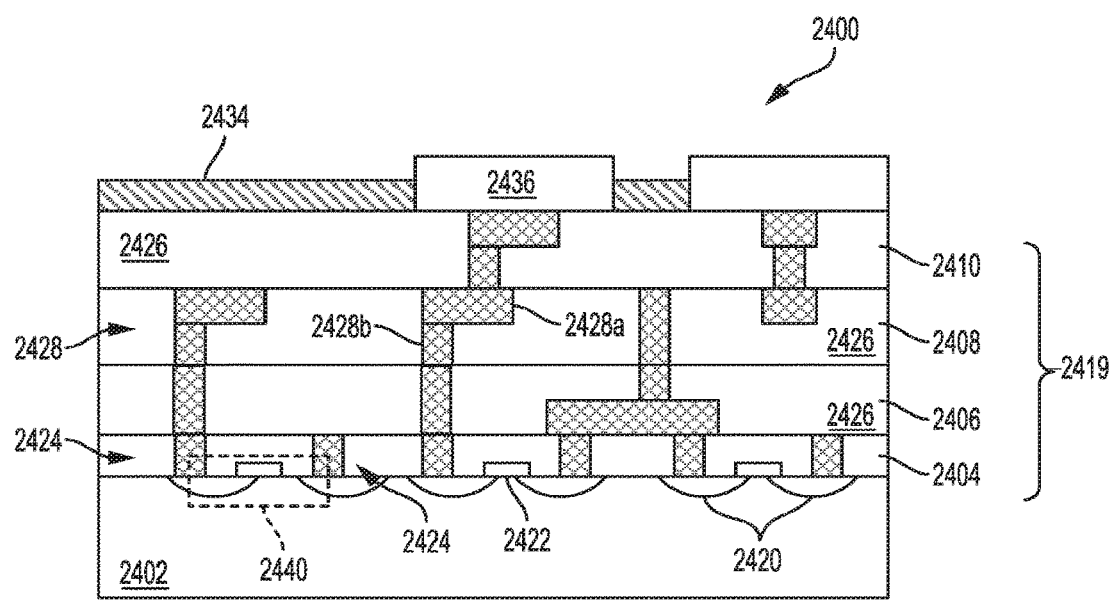
FIG. 40 is a cross-sectional side view of an IC device that may include an IC contact structure in accordance with any of the embodiments disclosed herein.

FIG. 40 is a cross-sectional side view of an IC device 2400 that may include one or more IC contact structures in accordance with any of the embodiments disclosed herein (e.g., any of the IC contact structures 100 or 200). The IC device 2400 may be formed on a substrate 2402 (e.g., the wafer 2300 of FIG. 39A) and may be included in a die (e.g., the die 2302 of FIG. 39B). The substrate 2402 may be a semiconductor substrate composed of semiconductor material systems including, for example, n-type or p-type materials systems. The substrate 2402 may include, for example, a crystalline substrate formed using a bulk silicon or a silicon-on-insulator substructure. In some embodiments, the semiconductor substrate 2402 may be formed using alternative materials, which may or may not be combined with silicon, that include but are not limited to germanium, indium antimonide, lead telluride, indium arsenide, indium phosphide, gallium arsenide, or gallium antimonide. Further materials classified as group II-VI, III-V, or IV may also be used to form the substrate 2402. Although a few examples of materials from which the substrate 2402 may be formed are described here, any material that may serve as a foundation for an IC device 2400 may be used. The substrate 2402 may be part of a singulated die (e.g., the dies 2302 of FIG. 39B) or a wafer (e.g., the wafer 2300 of FIG. 39A).

The IC device 2400 may include one or more device layers 2404 disposed on the substrate 2402. The device layer 2404 may include features of one or more transistors 2440 (e.g., metal oxide semiconductor field effect transistors (MOSFETs)) formed on the substrate 2402. The device layer 2404 may include, for example, one or more source and/or drain (S/D) regions 2420, a gate 2422 to control current flow in transistors 2440 between the S/D regions 2420, and one or more S/D contacts 2424 to route electrical signals to/from the S/D regions 2420. The transistors 2440 may include additional features not depicted for the sake of clarity, such as device isolation regions, gate contacts, and the like. The transistors 2440 are not limited to the type and configuration depicted in FIG. 40 and may include a wide variety of other types and configurations such as, for example, planar transistors, non-planar transistors, or a combination of both. Non-planar transistors may include FinFET transistors, such as double-gate transistors or tri-gate transistors, and wrap-around or all-around gate transistors, such as nanoribbon and nanowire transistors. The transistors 150 discussed above may take the form of any of the transistors 2440 discussed herein.

Although FIG. 40 illustrates a single "front-end" device layer 2404 (i.e., a device layer located on or closest to the substrate 2402), the IC device 2400 may include multiple device layers 2404 located "higher up" in the stack of the IC device 2400. In particular, the IC device 2400 may include one or more additional, non-front-end ("back-end") device layers 2404, some of which may be separated from the front-end device layer 2404 by one or more intervening interconnect layers. Any of the IC contact structures disclosed herein may include an electrical element 106 in the back-end of an IC device 2400, or an electrical element 106 in another layer of the IC device 2400.

Although the transistors 2440 illustrated in FIG. 40 are planar transistors, the IC device 2400 may include non-planar transistors and/or multi-transistor structures arranged vertically on a fin, as illustrated in FIGS. 25-36, in addition to or instead of planar transistors. Additionally, a computing device (e.g., the computing device 2600 of FIG. 42) may include planar transistors, non-planar transistors, devices with multiple transistors arranged vertically on a fin, etc. Any suitable ones of the materials used in the transistors 2440, or processes used to form the transistors 2440, may be used to form the transistors 150 (and the IC contact structures) disclosed herein.

Each transistor 2440 may include a gate 2422 formed of at least two layers, a gate dielectric layer and a gate electrode layer. The gate dielectric layer may include one layer or a stack of layers. The one or more layers may include silicon oxide, silicon dioxide, and/or a high-k dielectric material. The high-k dielectric material may include elements such as hafnium, silicon, oxygen, titanium, tantalum, lanthanum, aluminum, zirconium, barium, strontium, yttrium, lead, scandium, niobium, and zinc. Examples of high-k materials that may be used in the gate dielectric layer include, but are not limited to, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate. In some embodiments, an annealing process may be carried out on the gate dielectric layer to improve its quality when a high-k material is used.

The gate electrode layer may be formed on the gate dielectric layer and may include at least one p-type work function metal or n-type work function metal, depending on whether the transistor 2440 is to be a PMOS or an NMOS transistor. In some implementations, the gate electrode layer may consist of a stack of two or more metal layers, where one or more metal layers are work function metal layers and at least one metal layer is a fill metal layer. Further metal layers may be included for other purposes, such as a barrier layer. For a PMOS transistor, metals that may be used for the gate electrode include, but are not limited to, ruthenium, palladium, platinum, cobalt, nickel, conductive metal oxides (e.g., ruthenium oxide). For an NMOS transistor, metals that may be used for the gate electrode include, but are not limited to, hafnium, zirconium, titanium, tantalum, aluminum, alloys of these metals, and carbides of these metals, such as hafnium carbide, zirconium carbide, titanium carbide, tantalum carbide, and aluminum carbide.

In some embodiments, when viewed as a cross-section of the transistor 2440 along the source-channel-drain direction, the gate electrode may consist of a U-shaped structure that includes a bottom portion substantially parallel to the surface of the substrate and two sidewall portions that are substantially perpendicular to the top surface of the substrate. In other embodiments, at least one of the metal layers that form the gate electrode may simply be a planar layer that is substantially parallel to the top surface of the substrate and does not include sidewall portions substantially perpendicular to the top surface of the substrate. In other embodiments, the gate electrode may consist of a combination of U-shaped structures and planar, non-U-shaped structures. For example, the gate electrode may consist of one or more U-shaped metal layers formed atop one or more planar, non-U-shaped layers.

In some embodiments, a pair of sidewall spacers (e.g., the sidewall spacers 118) may be formed on opposing sides of the gate stack to bracket the gate stack. The sidewall spacers may be formed from a material such as silicon nitride, silicon oxide, silicon carbide, silicon nitride doped with carbon, and silicon oxynitride. In some embodiments, a plurality of spacer pairs may be used; for instance, two pairs, three pairs, or four pairs of sidewall spacers may be formed on opposing sides of the gate stack. The sidewall spacers may be formed using conventional methods of forming selective spacers, as known in the art. In some embodiments, a conformal dielectric spacer layer, such as, but not limited to, silicon oxide, silicon nitride, silicon oxynitride, and combinations thereof, is first blanket-deposited on all structures. The dielectric spacer layer may be deposited in a conformal manner so that it has substantially equal thicknesses on both vertical surfaces and horizontal surfaces. The dielectric spacer layer may be deposited using conventional CVD methods such as low-pressure chemical vapor deposition (LPCVD) and plasma enhanced chemical vapor deposition (PECVD), for example. In some embodiments, the dielectric spacer layer may be deposited to a thickness between 2 nanometers and 10 nanometers. Next, an unpatterned anisotropic etch may be performed on the dielectric spacer layer using conventional anisotropic etch methods, such as reactive ion etching (RIE). During the anisotropic etching process, most of the dielectric spacer layer may be removed from horizontal surfaces, leaving the dielectric spacer layer on the vertical surfaces, as shown. Next, an unpatterned isotropic etch may be performed to remove the remaining dielectric spacer layer from any horizontal surfaces, leaving the sidewall spacers. In some embodiments, the isotropic etch is a wet etch process. In a specific embodiment, where the dielectric spacer layer is silicon nitride or silicon oxide, the isotropic etch may employ a wet etchant solution comprising phosphoric acid ($H_3PO_4$) or a buffered oxide etch (BOE), respectively. In an alternate embodiment, the isotropic etch may be a dry etch process. In one such embodiment, nitrogen trifluoride ($NF_3$) gas may be employed in a downstream plasma reactor to isotropically etch the dielectric spacer layers.

The S/D regions 2420 may be formed within the substrate 2402 adjacent to the gate 2422 of each transistor 2440. The S/D regions 2420 may be formed using either an implantation/diffusion process or an etching/growth process, as discussed above with reference to the doped portions 135 and the semiconductor material 122, respectively. In some embodiments, one or more layers of metal and/or metal alloys may be included in the S/D regions 2420.

Electrical signals, such as power and/or input/output (I/O) signals, may be routed to and/or from the transistors 2440 of the device layer 2404 through one or more interconnect layers disposed on the device layer 2404 (illustrated in FIG. 40 as interconnect layers 2406-2410). For example, electrically conductive features of the device layer 2404 (e.g., the gate 2422 and the S/D contacts 2424) may be electrically coupled with interconnect structures 2428 of the interconnect layers 2406-2410. The one or more interconnect layers 2406-2410 may form an interlayer dielectric (ILD) stack 2419 of the IC device 2400.

The interconnect structures 2428 may be arranged within the interconnect layers 2406-2410 to route electrical signals according to a wide variety of designs (in particular, the arrangement is not limited to the particular configuration of interconnect structures 2428 depicted in FIG. 40). Although a particular number of interconnect layers 2406-2410 is depicted in FIG. 40, embodiments of the present disclosure include IC devices having more or fewer interconnect layers 2406-2410 than depicted.

In some embodiments, the interconnect structures 2428 may include trench structures 2428a (sometimes referred to as "lines") and/or via structures 2428b (sometimes referred to as "holes") filled with an electrically conductive material such as a metal. The trench structures 2428a may be arranged to route electrical signals in a direction of a plane that is substantially parallel with a surface of the substrate 2402 upon which the device layer 2404 is formed. For example, the trench structures 2428a may route electrical signals in a direction in and out of the page from the perspective of FIG. 40. The via structures 2428b may be arranged to route electrical signals in a direction of a plane that is substantially perpendicular to the surface of the substrate 2402 upon which the device layer 2404 is formed. In some embodiments, the via structures 2428b may electrically couple trench structures 2428a of different interconnect layers 2406-2410 together.

The interconnect layers 2406-2410 may include a dielectric material 2426 disposed between the interconnect structures 2428, as shown in FIG. 40. In some embodiments, the dielectric material 2426 disposed between the interconnect structures 2428 in different ones of the interconnect layers 2406-2410 may have different compositions; in other embodiments, the composition of the dielectric material 2426 between different interconnect layers 2406-2410 may be the same.

A first interconnect layer 2406 (referred to as Metal 1 or "M1") may be formed directly on the device layer 2404. In some embodiments, the first interconnect layer 2406 may include trench structures 2428a and/or via structures 2428b, as shown. Trench structures 2428a of the first interconnect layer 2406 may be coupled with contacts (e.g., S/D contacts 2424) of the device layer 2404.

A second interconnect layer 2408 (referred to as Metal 2 or "M2") may be formed directly on the first interconnect layer 2406. In some embodiments, the second interconnect layer 2408 may include via structures 2428b to couple the trench structures 2428a of the second interconnect layer 2408 with the trench structures 2428a of the first interconnect layer 2406. Although the trench structures 2428a and the via structures 2428b are structurally delineated with a line within each interconnect layer (e.g., within the second interconnect layer 2408) for the sake of clarity, the trench structures 2428a and the via structures 2428b may be structurally and/or materially contiguous (e.g., simultaneously filled during a dual-damascene process) in some embodiments.

A third interconnect layer 2410 (referred to as Metal 3 or "M3") (and additional interconnect layers, as desired) may be formed in succession on the second interconnect layer 2408 according to similar techniques and configurations described in connection with the second interconnect layer 2408 on the first interconnect layer 2406.

The IC device 2400 may include a solder resist material 2434 (e.g., polyimide or similar material) and one or more bond pads 2436 formed on the interconnect layers 2406-2410. The bond pads 2436 may be electrically coupled with the interconnect structures 2428 and configured to route the electrical signals of transistor(s) 2440 to other external devices. For example, solder bonds may be formed on the one or more bond pads 2436 to mechanically and/or electrically couple a chip including the IC device 2400 with another component (e.g., a circuit board). The IC device 2400 may have other alternative configurations to route the electrical signals from the interconnect layers 2406-2410 than depicted in other embodiments. For example, the bond pads 2436 may be replaced by or may further include other analogous features (e.g., posts) that route the electrical signals to external components.

Figure 41:
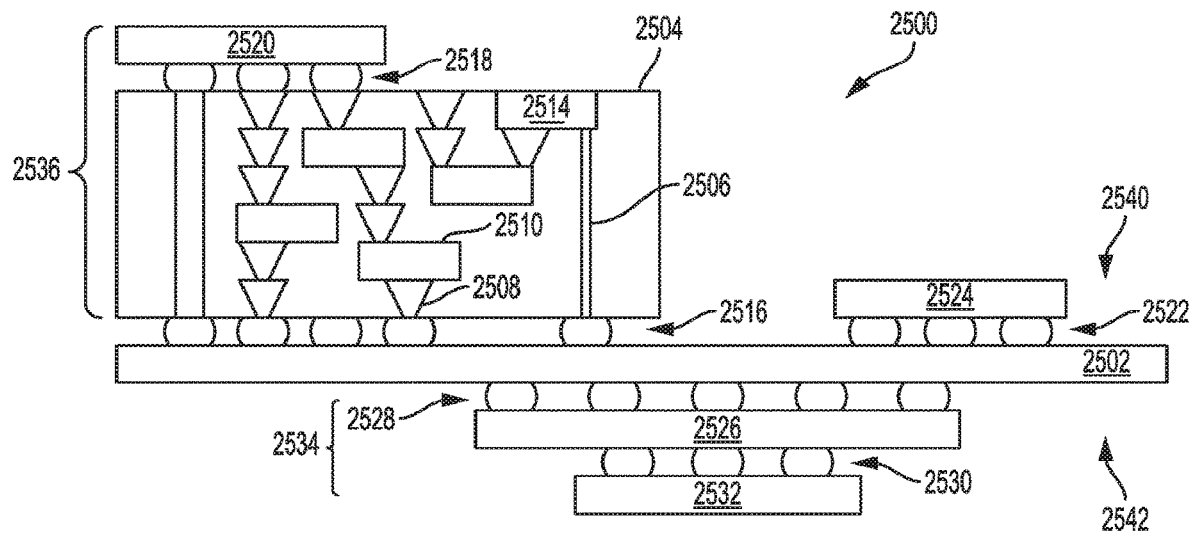
FIG. 41 is a cross-sectional side view of an IC device assembly that may include an IC contact structure in accordance with any of the embodiments disclosed herein.

FIG. 41 is a cross-sectional side view of an IC device assembly 2500 that may include one or more IC contact structures, in accordance with any of the embodiments disclosed herein (e.g., the IC contact structures 100 or 200). The IC device assembly 2500 includes a number of components disposed on a circuit board 2502 (which may be, for example, a motherboard). The IC device assembly 2500 includes components disposed on a first face 2540 of the circuit board 2502 and an opposing second face 2542 of the circuit board 2502; generally, components may be disposed on one or both faces 2540 and 2542.

In some embodiments, the circuit board 2502 may be a printed circuit board (PCB) including multiple metal layers separated from one another by layers of dielectric material and interconnected by electrically conductive vias. Any one or more of the metal layers may be formed in a desired circuit pattern to route electrical signals (optionally in conjunction with other metal layers) between the components coupled to the circuit board 2502. In other embodiments, the circuit board 2502 may be a non-PCB substrate.

The IC device assembly 2500 illustrated in FIG. 41 includes a package-on-interposer structure 2536 coupled to the first face 2540 of the circuit board 2502 by coupling components 2516. The coupling components 2516 may electrically and mechanically couple the package-on-interposer structure 2536 to the circuit board 2502, and may include solder balls (as shown in FIG. 41), male and female portions of a socket, an adhesive, an underfill material, and/or any other suitable electrical and/or mechanical coupling structure.

The package-on-interposer structure 2536 may include an IC package 2520 coupled to an interposer 2504 by coupling components 2518. The coupling components 2518 may take any suitable form for the application, such as the forms discussed above with reference to the coupling components 2516. Although a single IC package 2520 is shown in FIG. 41, multiple IC packages may be coupled to the interposer 2504; indeed, additional interposers may be coupled to the interposer 2504. The interposer 2504 may provide an intervening substrate used to bridge the circuit board 2502 and the IC package 2520. The IC package 2520 may be or include, for example, a die (the die 2302 of FIG. 39B), an IC device (e.g., the IC device 2400 of FIG. 40, or any of the assemblies disclosed herein), or any other suitable component. Generally, the interposer 2504 may spread a connection to a wider pitch or to reroute a connection to a different connection. For example, the interposer 2504 may couple the IC package 2520 (e.g., a die) to a ball grid array (BGA) of the coupling components 2516 for coupling to the circuit board 2502. In the embodiment illustrated in FIG. 41, the IC package 2520 and the circuit board 2502 are attached to opposing sides of the interposer 2504; in other embodiments, the IC package 2520 and the circuit board 2502 may be attached to a same side of the interposer 2504. In some embodiments, three or more components may be interconnected by way of the interposer 2504.

The interposer 2504 may be formed of an epoxy resin, a fiberglass-reinforced epoxy resin, a ceramic material, or a polymer material such as polyimide. In some implementations, the interposer 2504 may be formed of alternate rigid or flexible materials that may include the same materials described above for use in a semiconductor substrate, such as silicon, germanium, and other group III-V and group IV materials. The interposer 2504 may include metal interconnects 2508 and vias 2510, including but not limited to through-silicon vias (TSVs) 2506. The interposer 2504 may further include embedded devices 2514, including both passive and active devices. Such devices may include, but are not limited to, capacitors, decoupling capacitors, resistors, inductors, fuses, diodes, transformers, sensors, electrostatic discharge (ESD) devices, and memory devices. More complex devices such as radio-frequency (RF) devices, power amplifiers, power management devices, antennas, arrays, sensors, and microelectromechanical systems (MEMS) devices may also be formed on the interposer 2504. The package-on-interposer structure 2536 may take the form of any of the package-on-interposer structures known in the art.

The IC device assembly 2500 may include an IC package 2524 coupled to the first face 2540 of the circuit board 2502 by coupling components 2522. The coupling components 2522 may take the form of any of the embodiments discussed above with reference to the coupling components 2516, and the IC package 2524 may take the form of any of the embodiments discussed above with reference to the IC package 2520.

The IC device assembly 2500 illustrated in FIG. 41 includes a package-on-package structure 2534 coupled to the second face 2542 of the circuit board 2502 by coupling components 2528. The package-on-package structure 2534 may include an IC package 2526 and an IC package 2532 coupled together by coupling components 2530 such that the IC package 2526 is disposed between the circuit board 2502 and the IC package 2532. The coupling components 2528 and 2530 may take the form of any of the embodiments of the coupling components 2516 discussed above, and the IC packages 2526 and 2532 may take the form of any of the embodiments of the IC package 2520 discussed above. The package-on-package structure 2534 may be configured in accordance with any of the package-on-package structures known in the art.

Figure 42:
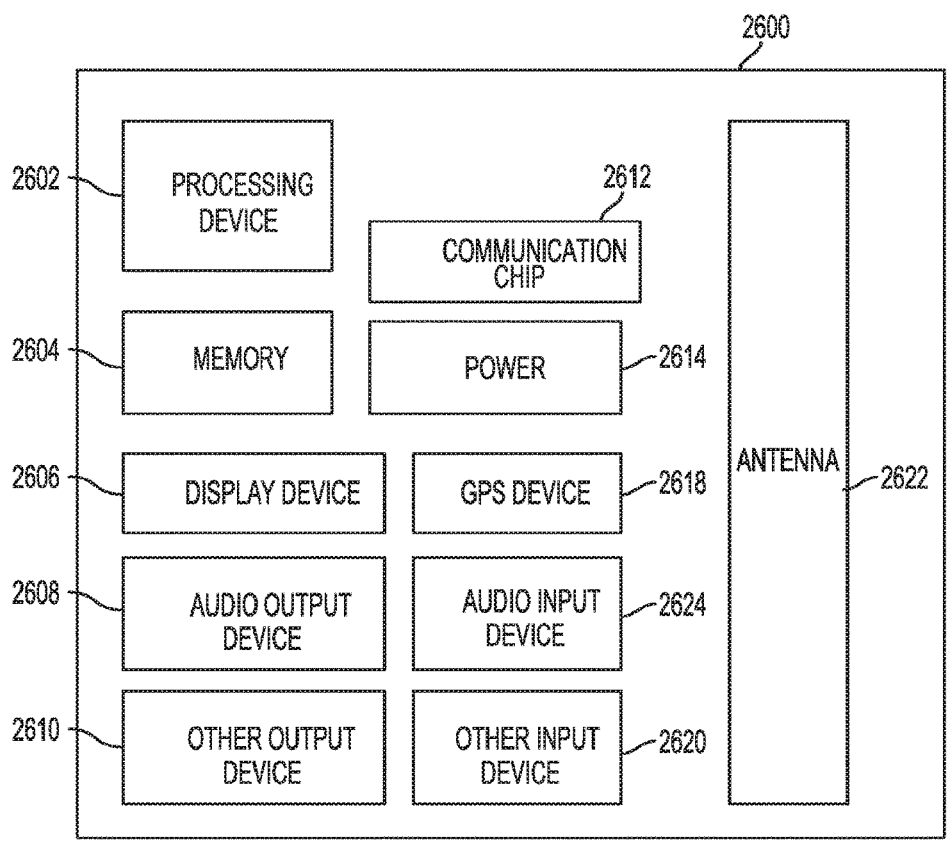
FIG. 42 is a block diagram of an example computing device that may include an IC contact structure in accordance with any of the embodiments disclosed herein.

FIG. 42 is a block diagram of an example computing device 2600 that may include one or more IC contact structures in accordance with the teachings of the present disclosure (e.g., any of the IC contact structures 100 or 200). A number of components are illustrated in FIG. 42 as included in the computing device 2600, but any one or more of these components may be omitted or duplicated, as suitable for the application. In some embodiments, some or all of the components included in the computing device 2600 may be attached to one or more motherboards. In some embodiments, some or all of these components are fabricated onto a single system-on-a-chip (SoC) die.

Additionally, in various embodiments, the computing device 2600 may not include one or more of the components illustrated in FIG. 42, but the computing device 2600 may include interface circuitry for coupling to the one or more components. For example, the computing device 2600 may not include a display device 2606, but may include display device interface circuitry (e.g., a connector and driver circuitry) to which a display device 2606 may be coupled. In another set of examples, the computing device 2600 may not include an audio input device 2624 or an audio output device 2608, but may include audio input or output device interface circuitry (e.g., connectors and supporting circuitry) to which an audio input device 2624 or audio output device 2608 may be coupled. Any one or more of the components of the computing device 2600 may be included in one or more IC devices that may include an embodiment of the IC contact structures disclosed herein.

The computing device 2600 may include a processing device 2602 (e.g., one or more processing devices). As used herein, the term "processing device" or "processor" may refer to any device or portion of a device that processes electronic data from registers and/or memory to transform that electronic data into other electronic data that may be stored in registers and/or memory. The processing device 2602 may include one or more digital signal processors (DSPs), application-specific integrated circuits (ASICs), central processing units (CPUs), graphics processing units (GPUs), cryptoprocessors (specialized processors that execute cryptographic algorithms within hardware), server processors, or any other suitable processing devices. The computing device 2600 may include a memory 2604, which may itself include one or more memory devices such as volatile memory (e.g., dynamic random access memory (DRAM)), non-volatile memory (e.g., read-only memory (ROM)), flash memory, solid state memory, and/or a hard drive. In some embodiments, the memory 2604 may include memory that shares a die with the processing device 2602. This memory may be used as cache memory and may include embedded dynamic random access memory (eDRAM) or spin-transfer torque MRAM (STT-MRAM). The processing device 2602 and/or the memory 2604 may include one or more of the IC contact structures disclosed herein.

In some embodiments, the computing device 2600 may include a communication chip 2612 (e.g., one or more communication chips). For example, the communication chip 2612 may be configured for managing wireless communications for the transfer of data to and from the computing device 2600. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not.

The communication chip 2612 may implement any of a number of wireless standards or protocols, including but not limited to Institute for Electrical and Electronic Engineers (IEEE) standards including Wi-Fi (IEEE 802.11 family), IEEE 802.16 standards (e.g., IEEE 802.16-2005 Amendment), Long-Term Evolution (LTE) project along with any amendments, updates, and/or revisions (e.g., advanced LTE project, ultra mobile broadband (UMB) project (also referred to as "3GPP2"), etc.). IEEE 802.16 compatible Broadband Wireless Access (BWA) networks are generally referred to as WiMAX networks, an acronym that stands for Worldwide Interoperability for Microwave Access, which is a certification mark for products that pass conformity and interoperability tests for the IEEE 802.16 standards. The communication chip 2612 may operate in accordance with a Global System for Mobile Communication (GSM), General Packet Radio Service (GPRS), Universal Mobile Telecommunications System (UMTS), High Speed Packet Access (HSPA), Evolved HSPA (E-HSPA), or LTE network. The communication chip 2612 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). The communication chip 2612 may operate in accordance with Code Division Multiple Access (CDMA), Time Division Multiple Access (TDMA), Digital Enhanced Cordless Telecommunications (DECT), Evolution-Data Optimized (EV-DO), and derivatives thereof, as well as any other wireless protocols that are designated as 3G, 4G, 5G, and beyond. The communication chip 2612 may operate in accordance with other wireless protocols in other embodiments. The computing device 2600 may include an antenna 2622 to facilitate wireless communications and/or to receive other wireless communications (such as AM or FM radio transmissions).

In some embodiments, the communication chip 2612 may manage wired communications, such as electrical, optical, or any other suitable communication protocols (e.g., the Ethernet). As noted above, the communication chip 2612 may include multiple communication chips. For instance, a first communication chip 2612 may be dedicated to shorter-range wireless communications such as Wi-Fi or Bluetooth, and a second communication chip 2612 may be dedicated to longer-range wireless communications such as GPS, EDGE, GPRS, CDMA, WiMAX, LTE, EV-DO, or others. In some embodiments, a first communication chip 2612 may be dedicated to wireless communications, and a second communication chip 2612 may be dedicated to wired communications. The communication chip 2612 may include one or more of the IC contact structures disclosed herein.

The computing device 2600 may include battery/power circuitry 2614. The battery/power circuitry 2614 may include one or more energy storage devices (e.g., batteries or capacitors) and/or circuitry for coupling components of the computing device 2600 to an energy source separate from the computing device 2600 (e.g., AC line power).

The computing device 2600 may include a display device 2606 (or corresponding interface circuitry, as discussed above). The display device 2606 may include any visual indicators, such as a heads-up display, a computer monitor, a projector, a touchscreen display, a liquid crystal display (LCD), a light-emitting diode display, or a flat panel display, for example.

The computing device 2600 may include an audio output device 2608 (or corresponding interface circuitry, as discussed above). The audio output device 2608 may include any device that generates an audible indicator, such as speakers, headsets, or earbuds, for example.

The computing device 2600 may include an audio input device 2624 (or corresponding interface circuitry, as discussed above). The audio input device 2624 may include any device that generates a signal representative of a sound, such as microphones, microphone arrays, or digital instruments (e.g., instruments having a musical instrument digital interface (MIDI) output).

The computing device 2600 may include a global positioning system (GPS) device 2618 (or corresponding interface circuitry, as discussed above). The GPS device 2618 may be in communication with a satellite-based system and may receive a location of the computing device 2600, as known in the art.

The computing device 2600 may include an other output device 2610 (or corresponding interface circuitry, as discussed above). Examples of the other output device 2610 may include an audio codec, a video codec, a printer, a wired or wireless transmitter for providing information to other devices, or an additional storage device.

The computing device 2600 may include an other input device 2620 (or corresponding interface circuitry, as discussed above). Examples of the other input device 2620 may include an accelerometer, a gyroscope, a compass, an image capture device, a keyboard, a cursor control device such as a mouse, a stylus, a touchpad, a bar code reader, a Quick Response (QR) code reader, any sensor, or a radio frequency identification (RFID) reader.

The computing device 2600 may have any desired form factor, such as a hand-held or mobile computing device (e.g., a cell phone, a smart phone, a mobile internet device, a music player, a tablet computer, a laptop computer, a netbook computer, an ultrabook computer, a personal digital assistant (PDA), an ultra-mobile personal computer, etc.), a desktop computing device, a server or other networked computing component, a printer, a scanner, a monitor, a set-top box, an entertainment control unit, a vehicle control unit, a digital camera, a digital video recorder, or a wearable computing device. In some embodiments, the computing device 2600 may be any other electronic device that processes data.

The following paragraphs provide various examples of the embodiments disclosed herein.

Example 1 is an integrated circuit (IC) contact structure, including: an electrical element; a metal on the electrical element; and a semiconductor material on the metal, wherein the metal conductively couples the semiconductor material and the electrical element.

Example 2 may include the subject matter of Example 1, and may further specify that the electrical element includes a conductive line.

Example 3 may include the subject matter of any of Examples 1-2, and may further specify that the electrical element includes an epitaxial semiconductor material portion of a transistor.

Example 4 may include the subject matter of any of Examples 1-3, and may further specify that the electrical element includes a source/drain of a transistor.

Example 5 may include the subject matter of Example 4, and may further specify that the transistor is a back-end transistor.

Example 6 may include the subject matter of Example 4, and may further specify that the transistor is not a back-end transistor.

Example 7 may include the subject matter of any of Examples 1-6, and may further specify that the metal includes tungsten, titanium, nickel, platinum, gold, tantalum, molybdenum, erbium, strontium, magnesium, scandium, niobium, vanadium, cesium, calcium, zinc, copper, cobalt, nickel zirconium, yttrium, sulfur, manganese, iron, indium, tin, antimony, bismuth, cadmium, silver, palladium, rhodium, ruthenium, rubidium, selenium, gallium, osmium, rhenium, hafnium, or a lanthanide.

Example 8 may include the subject matter of any of Examples 1-7, and may further specify that the semiconductor material is an epitaxial semiconductor material.

Example 9 may include the subject matter of any of Examples 1-8, and may further specify that the semiconductor material is part of a source/drain of a transistor.

Example 10 may include the subject matter of Example 9, and may further specify that the transistor is a non-planar transistor.

Example 11 may include the subject matter of Example 10, and may further specify that the transistor is a trigate transistor.

Example 12 may include the subject matter of any of Examples 9-11, and may further specify that the semiconductor material has a height between 10 nanometers and 80 nanometers.

Example 13 may include the subject matter of any of Examples 1-12, and may further specify that the metal extends around an end of a semiconductor fin.

Example 14 may include the subject matter of any of Examples 1-13, and may further include a semiconductor fin between the electrical element and the semiconductor material.

Example 15 may include the subject matter of Example 14, and may further specify that the semiconductor material is also on the semiconductor fin.

Example 16 may include the subject matter of Example 15, and may further specify that the semiconductor material is crystalline above the semiconductor fin, and polycrystalline above the metal.

Example 17 may include the subject matter of any of Examples 14-16, and may further specify that the semiconductor fin is adjacent to the metal.

Example 18 may include the subject matter of any of Examples 14-17, and may further include an insulating material between the semiconductor fin and the electrical element.

Example 19 may include the subject matter of any of Examples 1-18, and may further specify that the metal is a first metal, and the IC contact structure further includes a second metal on the semiconductor material and on the first metal.

Example 20 may include the subject matter of any of Examples 1-19, and may further specify that the IC contact structure is between two isolation walls.

Example 21 is a method of forming an integrated circuit (IC) contact structure, including: providing a metal on an electrical element in an IC device; and growing a semiconductor material at least partially on the metal.

Example 22 may include the subject matter of Example 21, and may further include providing additional metal on the semiconductor material.

Example 23 may include the subject matter of Example 22, and may further specify that the additional metal is provided above and on side faces of the semiconductor material.

Example 24 may include the subject matter of any of Examples 21-23, and may further include, before providing the metal on the electrical element, forming a semiconductor body above the electrical element, wherein an insulating material is disposed between the semiconductor body and the electrical element; wherein the semiconductor material extends over the semiconductor body.

Example 25 may include the subject matter of Example 24, and may further specify that the semiconductor body includes a fin or a nanowire.

Example 26 may include the subject matter of any of Examples 21-25, and may further specify that growing the semiconductor material on the metal includes: providing a conformal layer of epitaxial material on the metal; and growing additional epitaxial material on the conformal layer.

Example 27 may include the subject matter of Example 26, and may further include: after providing the conformal layer of epitaxial material, depositing a sacrificial material; recessing the sacrificial material; removing portions of the conformal layer of epitaxial material that are not covered by the sacrificial material; and removing the sacrificial material.

Example 28 may include the subject matter of any of Examples 21-27, and may further include stopping growth of the semiconductor material after it contacts adjacent isolation walls.

Example 29 may include the subject matter of any of Examples 21-27, and may further include stopping growth of the semiconductor material before it contacts adjacent isolation walls.

Example 30 is a computing device, including: a processing device including an electrical element, a metal on the electrical element, and an epitaxial material on the metal, wherein the metal conductively couples the epitaxial material and the electrical element; and a memory device in electrical communication with the processing device.

Example 31 may include the subject matter of Example 30, and may further specify that the epitaxial material is a part of a transistor.

Example 32 may include the subject matter of any of Examples 30-31, and may further specify that the electrical element is part of a diode, a varactor, a capacitor, a variable resistor, a transistor, or a memory cell.

Example 33 may include the subject matter of any of Examples 30-32, and may further include a communication chip.

Example 34 is an integrated circuit (IC) contact structure, including: an electrical element; a metal on the electrical element; and a semiconductor material having a doped region that is adjacent to the metal, wherein the metal conductively couples the doped region and the electrical element.

Example 35 may include the subject matter of Example 34, and may further specify that the electrical element includes a conductive line.

Example 36 may include the subject matter of any of Examples 34-35, and may further specify that the electrical element includes an epitaxial semiconductor material portion of a transistor.

Example 37 may include the subject matter of any of Examples 34-36, and may further specify that the electrical element includes a source/drain of a transistor.

Example 38 may include the subject matter of Example 37, and may further specify that the transistor is a back-end transistor.

Example 39 may include the subject matter of Example 37, and may further specify that the transistor is not a back-end transistor.

Example 40 may include the subject matter of any of Examples 34-39, and may further specify that the metal includes tungsten, titanium, nickel, platinum, gold, tantalum, molybdenum, erbium, strontium, magnesium, scandium, niobium, vanadium, cesium, calcium, zinc, copper, cobalt, nickel zirconium, yttrium, sulfur, manganese, iron, indium, tin, antimony, bismuth, cadmium, silver, palladium, rhodium, ruthenium, rubidium, selenium, gallium, osmium, rhenium, hafnium, or a lanthanide.

Example 41 may include the subject matter of any of Examples 34-40, and may further specify that the metal is adjacent to at least one lateral face of the doped region, and extends above the doped region.

Example 42 may include the subject matter of any of Examples 34-41, and may further specify that the doped region is a source/drain of a transistor.

Example 43 may include the subject matter of Example 42, and may further specify that the transistor is a non-planar transistor.

Example 44 may include the subject matter of Example 43, and may further specify that the transistor is a trigate transistor.

Example 45 may include the subject matter of any of Examples 34-44, and may further specify that the metal extends laterally around the doped region.

Example 46 may include the subject matter of any of Examples 34-45, and may further include an insulating material between the semiconductor material and the electrical element.

Example 47 may include the subject matter of any of Examples 34-46, and may further specify that the IC contact structure is between two isolation walls.

Example 48 is a method of forming an integrated circuit (IC) contact structure, including: forming a semiconductor body above an electrical element in an IC device; doping a portion of the semiconductor body to form a doped region; and providing a metal adjacent to the doped region and extending down to the electrical element to conductively couple the doped region and the electrical element.

Example 49 may include the subject matter of Example 48, and may further specify that the electrical element includes a source/drain of a transistor.

Example 50 may include the subject matter of Example 49, and may further specify that the electrical element includes an epitaxial semiconductor material.

Example 51 may include the subject matter of any of Examples 48-50, and may further specify that the metal is laterally adjacent to the doped region, and extends above the doped region.

Example 52 may include the subject matter of any of Examples 48-51, and may further specify that the semiconductor body includes a fin or a nanowire.

Example 53 may include the subject matter of any of Examples 48-52, and may further specify that doping the portion of the semiconductor body includes implanting a dopant into the portion of the semiconductor body.

Example 54 is a computing device, including: a processing device including an electrical element, a metal on the electrical element, and a semiconductor material having a doped region that is adjacent to the metal, wherein the metal conductively couples the doped region and the electrical element; and a memory device in electrical communication with the processing device.

Example 55 may include the subject matter of Example 54, and may further specify that the doped region is a part of a transistor.

Example 56 may include the subject matter of any of Examples 54-55, and may further specify that the electrical element includes an epitaxial source/drain portion of a transistor.

Example 57 may include the subject matter of any of Examples 54-56, and may further include a communication chip.

What is claimed is:

1. An integrated circuit (IC) contact structure, comprising:
an electrical element;

a metal on the electrical element;
a semiconductor material on the metal, wherein the metal conductively couples the semiconductor material and the electrical element;
a semiconductor fin between the electrical element and the semiconductor material, wherein the semiconductor material is on and in physical contact with the semiconductor fin, and wherein the semiconductor material is crystalline above the semiconductor fin, and polycrystalline above the metal; and
an insulating material between the semiconductor fin and the metal.

2. The IC contact structure of claim 1, wherein the electrical element includes a conductive line.

3. The IC contact structure of claim 1, wherein the electrical element includes an epitaxial semiconductor material portion of a transistor.

4. The IC contact structure of claim 1, wherein the electrical element includes a source/drain of a transistor.

5. The IC contact structure of claim 4, wherein the transistor is a back-end transistor.

6. The IC contact structure of claim 4, wherein the transistor is not a back-end transistor.

7. The IC contact structure of claim 1, wherein the semiconductor material is part of a source/drain of a transistor.

8. The IC contact structure of claim 7, wherein the transistor is a non-planar transistor.

9. The IC contact structure of claim 1, wherein the metal extends around an end of the semiconductor fin.

10. The IC contact structure of claim 1, wherein the semiconductor fin is adjacent to the metal.

11. The IC contact structure of claim 1, further comprising:
a second insulating material between the semiconductor fin and the electrical element.

12. The IC contact structure of claim 1, wherein the metal is a first metal, and the IC contact structure further comprises:
a second metal on the semiconductor material and on the first metal.

13. The IC contact structure of claim 1, wherein the IC contact structure is between two isolation walls.

14. A method of forming an integrated circuit (IC) contact structure, comprising:
providing a semiconductor fin on an electrical element in an IC device;
providing a metal on the electrical element in the IC device;
providing an insulating material between the semiconductor fin and the metal; and
growing a semiconductor material at least partially on the metal and directly on the semiconductor fin, wherein the semiconductor material is crystalline above the semiconductor fin, and polycrystalline above the metal.

15. The method of claim 14, wherein a second insulating material is disposed between the semiconductor fin and the electrical element.

16. An integrated circuit (IC) contact structure, comprising:
an electrical element;
a metal on the electrical element;
a semiconductor material on the metal, wherein the metal conductively couples the semiconductor material and the electrical element; and
a semiconductor fin between the electrical element and the semiconductor material, wherein the semiconductor material is on the semiconductor fin, and the semiconductor material is crystalline above the semiconductor fin, and polycrystalline above the metal.

17. The IC contract structure of claim 16, wherein the electrical element includes an epitaxial semiconductor material portion of a transistor.

18. The IC contract structure of claim 16, wherein the metal extends around an end of the semiconductor fin.

19. The IC contact structure of claim 16, wherein the semiconductor fin is adjacent to the metal.

20. The IC contact structure of claim 16, wherein the IC contact structure is between two isolation walls.

* * * * *

UNITED STATES PATENT AND TRADEMARK OFFICE
CERTIFICATE OF CORRECTION

| | | |
|---|---|---|
| PATENT NO. | : 11,942,526 B2 | Page 1 of 1 |
| APPLICATION NO. | : 16/487077 | |
| DATED | : March 26, 2024 | |
| INVENTOR(S) | : Patrick Morrow et al. | |

It is certified that error appears in the above-identified patent and that said Letters Patent is hereby corrected as shown below:

In the Claims

In Column 30, Claim 17, Line 31, delete "IC contract" and insert -- IC contact --, therefor.

In Column 30, Claim 18, Line 34, delete "IC contract" and insert -- IC contact --, therefor.

Signed and Sealed this
Thirtieth Day of April, 2024

Katherine Kelly Vidal
*Director of the United States Patent and Trademark Office*